United States Patent
Honjo et al.

(10) Patent No.: US 10,749,107 B2
(45) Date of Patent: Aug. 18, 2020

(54) METHOD OF MANUFACTURING MAGNETIC TUNNEL COUPLING ELEMENT

(71) Applicant: TOHOKU UNIVERSITY, Sendai-shi, Miyagi (JP)

(72) Inventors: Hiroaki Honjo, Sendai (JP); Shoji Ikeda, Sendai (JP); Hideo Sato, Sendai (JP); Tetsuo Endoh, Sendai (JP); Hideo Ohno, Sendai (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 16/320,260

(22) PCT Filed: Mar. 17, 2017

(86) PCT No.: PCT/JP2017/011040
§ 371 (c)(1),
(2) Date: Jan. 24, 2019

(87) PCT Pub. No.: WO2018/020730
PCT Pub. Date: Feb. 1, 2018

(65) Prior Publication Data
US 2019/0229262 A1     Jul. 25, 2019

(30) Foreign Application Priority Data

Jul. 29, 2016   (JP) .................. 2016-150154

(51) Int. Cl.
*H01L 43/12* (2006.01)
*C23C 14/14* (2006.01)
(Continued)

(52) U.S. Cl.
CPC .............. *H01L 43/12* (2013.01); *C23C 14/14* (2013.01); *C23C 14/34* (2013.01);
(Continued)

(58) Field of Classification Search
CPC ..... H01L 43/12; H01L 27/105; H01L 21/8239; H01L 43/10; H01L 27/226; H01L 43/08; H01L 27/228; C23C 14/34; C23C 14/14
See application file for complete search history.

(56) References Cited

U.S. PATENT DOCUMENTS

2009/0166182 A1   7/2009  Noma
2010/0173174 A1   7/2010  Imakita
(Continued)

FOREIGN PATENT DOCUMENTS

JP   2009-158752 A   7/2009
JP   2011-155073 A   8/2011
(Continued)

OTHER PUBLICATIONS

Sato et al., "Perpendicular-anisotropy CoFeB—MgO magnetic tunnel junctions with a MgO/CoFeBiTa/CoFeB/MgO recording structure", Appl. Phys. Lett., 2012, 101, 022414, cited in Specification (5 pages).
(Continued)

*Primary Examiner* — Selim U Ahmed
(74) *Attorney, Agent, or Firm* — Westerman, Hattori, Daniels & Adrian, LLP

(57) ABSTRACT

A magnetic tunnel junction element configured by stacking, in a following stack order, a fixed layer formed of a ferromagnetic body and in which a magnetization direction is fixed, a magnetic coupling layer formed of a nonmagnetic body, a reference layer formed of a ferromagnetic body and in which the magnetization direction is fixed, a barrier layer formed of a nonmagnetic body, and a recording layer formed of a ferromagnetic body, a barrier layer formed of a nonmagnetic body, and a recording layer formed by sandwiching an insertion layer formed of a nonmagnetic body between first and second ferromagnetic layers, wherein the magnetic coupling layer is formed using a sputtering gas in
(Continued)

which a value of a ratio in which a mass number of an element used in the magnetic coupling layer divided by the mass number of the sputtering gas itself is 2.2 or smaller.

5 Claims, 16 Drawing Sheets

(51) Int. Cl.
    *C23C 14/34*     (2006.01)
    *H01L 43/08*     (2006.01)
    *H01L 21/8239*     (2006.01)
    *H01L 27/105*     (2006.01)
    *H01L 27/22*     (2006.01)
    *H01L 43/10*     (2006.01)

(52) U.S. Cl.
    CPC ........ *H01L 21/8239* (2013.01); *H01L 27/105* (2013.01); *H01L 27/226* (2013.01); *H01L 43/08* (2013.01); *H01L 43/10* (2013.01); *H01L 27/228* (2013.01)

(56) References Cited

U.S. PATENT DOCUMENTS

| | | |
|---|---|---|
| 2012/0320666 A1 | 12/2012 | Ohno et al. |
| 2013/0028013 A1 | 1/2013 | Ikeda et al. |
| 2014/0340961 A1 | 11/2014 | Ohno et al. |
| 2015/0109853 A1* | 4/2015 | Sato ................. H01F 10/3286 365/158 |
| 2016/0133831 A1* | 5/2016 | Kim ..................... H01L 43/12 204/192.24 |
| 2017/0025600 A1 | 1/2017 | Ohno et al. |

FOREIGN PATENT DOCUMENTS

| | | |
|---|---|---|
| JP | 2014-207469 A | 10/2014 |
| JP | 2015-207775 A | 11/2015 |
| WO | 2008/152915 A1 | 12/2008 |
| WO | 2013/069091 A1 | 5/2013 |
| WO | 2013/153942 A1 | 10/2013 |

OTHER PUBLICATIONS

International Search Report (Form PCT/ISA/210) dated May 16, 2017, issued in counterpart application No. PCT/JP2017/011040, w/English translation (5 pages).

Written Opinion (Form PCT/ISA/237) dated May 16, 2017, issued in counterpart International Application No. PCT/JP2017/011040 (7 pages).

IPRP(Chapter II) (Form PCT/IPEA/409) dated Sep. 26, 2017, issued in counterpart International Application No. PCT/JP2017/011040, w/English translation of PCT/IB/338, PCT/IPEA/409 (10 pages).

* cited by examiner

METHOD OF MANUFACTURING MAGNETIC TUNNEL COUPLING ELEMENT

TECHNICAL FIELD

The present invention relates to a magnetic tunnel junction element and a method for manufacturing the same.

BACKGROUND ART

In a magnetic switching using spin transfer torque (hereinafter referred to as "STT"), writing current become small as the element size decreases, so that it is suitable for high density and low power memory element. Recently, magnetic random access memory (MRAM) utilizing such magnetic switching of STT (STT-MRAM) is attracting much attention.

STT-MRAM is composed of a magnetic tunnel junction (MTJ) element (hereinafter sometimes referred to as "MTJ element"). The MTJ element adopts a structure where a tunnel barrier layer (tunnel insulating film) is sandwiched between a reference (fixed) layer having a fixed magnetization direction and a recording (free) layer in which the magnetization direction varies.

Performance of the MTJ element is represented by tunnel magnetoresistance ratio (TMR ratio), thermal stability and threshold current. The TMR ratio is a value defined by $(R_{ap}-R_p)/R_p$ (wherein $R_p$ represents a resistance value in a state where magnetization of the reference layer and magnetization of the recording layer that are arranged adjacent to the barrier layer are arranged in parallel, and $R_{ap}$ represents a resistance value in a state where magnetization of the reference layer and the magnetization of the recording layer that are arranged adjacent to the barrier layer are arranged in antiparallel). Further, thermal stability is a value that is proportional to $K_{eff}\cdot V/k_B T$ (wherein $K_{eff}$ represents effective magnetic anisotropy energy density of the recording layer, V represents volume of the recording layer, $k_B$ represents Boltzmann's constant, and T represents absolute temperature). Generally, the TMR ratio of the MTJ element should preferably be greater, and the value having divided the thermal stability by threshold current should preferably be greater.

If the MTJ element has a magnetic anisotropy with perpendicular easy axis, the magnetic switching path is the same between STT switching and thermal switching. Meanwhile, if the MTJ element has an in-plane magnetic anisotropy, magnetic switching path caused by STT differs from that caused by thermal inversion. In this case, inversion by STT causes magnetization to flow through a plane-perpendicular direction having a large demagnetizing field, whereas in thermal inversion, magnetization flows through an in-plane direction having a small demagnetizing field. As a result, in in-plane magnetization, ratio of thermal stability to threshold current is small compared to perpendicular magnetization. Therefore, perpendicular magnetization-type MTJ element is attracting much attention recently, and such perpendicular magnetization-type MTJ element is being used.

As an example of such perpendicular magnetization-type MTJ element, an element having a high TMR ratio, high thermal stability and low threshold current is developed by using a ferromagnetic layer formed of CoFeB and an MgO insulation film (refer to Japanese Patent Literature 1), and the use of such materials as bases is investigated.

Further, in order to improve perpendicular magnetic anisotropy, a structure (double interface structure) such as an MgO (barrier layer)/CoFeB (recording layer)/MgO (protective layer) structure in which the recording layer (CoFeB) is sandwiched between the barrier layer (MgO) and the protective layer (MgO) containing oxygen has been developed (refer for example to Japanese Patent Literature 1). Further, materials adopting a double interface structure in which a conductive oxide layer is used as the protective layer or further having a metal cap layer arranged above the protective layer are developed (refer for example to Japanese Patent Literature 2).

The MTJ element having such double interface structure can realize a recording layer thickness that is greater than that of a tunnel junction element that does not have an MgO protective layer, due to two perpendicular magnetic anisotropies that are caused in the CoFeB/MgO interface under the recording layer and above the recording layer. Since thermal stability increases in proportion to the recording layer thickness, thermal stability can be improved by increasing the film thickness. Simultaneously, by increasing the recording layer thickness, damping constant $\alpha$ of the recording layer may also be reduced. Since the write current value is in proportion to the damping constant $\alpha$, the write current value can be reduced at the same time. As a result, MTJ element having a double interface structure has high thermal stability and small write current, that is, the value obtained by dividing thermal stability by threshold current is high.

Meanwhile, in the MTJ element that has no MgO protective layer, a protective layer of Ta and the like is formed instead of the MgO protective layer on the recording layer. In this case, since Ta absorbs boron through heat processing, CoFeB is crystallized and a high TMR ratio is obtained.

However, since the MTJ element having a double interface structure described in Patent Literatures 1 and 2 sandwiches CoFeB with MgO, and it does not have a cap formed of Ta and the like, diffusion of boron by heat processing does not easily occur. Therefore, there was a drawback in that CoFeB is not crystallized by annealing and TMR ratio is deteriorated.

In order to prevent such deterioration of TMR ratio, an MTJ element having a thin nonmagnetic layer such as Ta inserted between the recording layer is proposed (refer for example to Non-Patent Literature 1). In this MTJ element, the nonmagnetic layer formed of Ta and the like absorbs boron through heat processing and CoFeB is crystallized, so that a high TMR ratio is obtained.

Further, an MTJ in which a reference layer of CoFeB interposing a thin Ta of approximately 4 Å so-called a magnetic coupling layer is formed on a film having a high perpendicular magnetic anisotropy such as a [Co/Pt] multilayer film serving as the magnetization fixed layer is proposed (refer for example to Non-Patent Literature 1). In a CoFeB/MgO/CoFeB tunnel junction, a high TMR ratio is obtained when the CoFeB and the MgO adopt a bcc crystal orientation. Since the [Co/Pt] has a crystal alignment property of fcc, if the CoFeB reference layer is directly formed thereon, a high TMR ratio cannot be obtained since CoFeB is crystally aligned to the fcc crystal orientation of [Co/Pt]. The magnetic coupling layer is used to disconnect the [Co/Pt] crystal alignment at this layer, so as to align the CoFeB in the bcc direction and to achieve a high TMR ratio.

CITATION LIST

Patent Literature

[PTL 1] Japanese Patent Application Laid-Open Publication No. 2014-207469

[PTL 2] PCT International Application Publication No. 2013/069091

Non Patent Literature

[NPL 1] H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett., 2012, 101, 022414

SUMMARY OF INVENTION

Technical Problem

However, according to the MTJ element disclosed in the above-described NPL 1, when a nonmagnetic layer formed of Ta and the like inserted between the recording layer and a magnetic coupling layer formed of a nonmagnetic body such as Ta and the like inserted between a fixed layer of [Co/Pt] and the CoFeB reference layer are subjected to heat treatment at a high temperature of 350° C. or higher, a phenomenon occurs in that Ta and the like diffuses the CoFeB in the recording layer or the reference layer so that it reaches a barrier layer. Further, a high melting point metal such as Ta and W having a high heat resistance is used as a layer formed of the nonmagnetic body, but since these materials have great atomic weight, a phenomenon occurs during film formation by sputtering where material such as Ta or W collides against the recording layer or the fixed layer of [Co/Pt] and damages the recording layer or the fixed layer of [Co/Pt]. This phenomenon is described layer in the example of the present invention, but as illustrated in the upper drawing of FIG. 10, it has been discovered through observation using EDX-ray (energy dispersive X-ray) analysis that the Pt constituting the fixed layer has been diffused.

This phenomenon presents a problem that causes the magnetic film to be damaged during film formation and the TMR ratio to drop.

The present invention focuses on this problem, and the object of the invention is to solve this problem and provide a method for manufacturing a magnetic tunnel junction element that has a higher TMR ratio and that is capable of preventing damage of the recording layer and the fixed layer during film formation, and a magnetic tunnel junction element formed by this method.

Solution to Problem

In order to achieve the object described above, the method for manufacturing a magnetic tunnel junction element according to the present invention provides configuring the magnetic tunnel junction element by stacking, in a following stack order, or alternatively, stacking in an opposite order as the following stack order, a fixed layer formed of a ferromagnetic body and in which a magnetization direction is fixed, a magnetic coupling layer formed of a nonmagnetic body, a reference layer formed of a ferromagnetic body and in which the magnetization direction is fixed, a barrier layer formed of a nonmagnetic body and a recording layer formed of a ferromagnetic body, wherein the magnetic coupling layer is formed using a sputtering gas in which a value of a ratio in which a mass number of an element used in the magnetic coupling layer divided by the mass number of the sputtering gas itself is 2.2 or smaller, or stacking, in a following stack order, or alternatively, configured by stacking in an opposite order as the following stack order, a reference layer formed of a ferromagnetic body and in which a magnetization direction is fixed, a barrier layer formed of a nonmagnetic body and a recording layer formed by sandwiching an insertion layer formed of a nonmagnetic body between first and second ferromagnetic layers, wherein the insertion layer is formed using a sputtering gas in which a value of a ratio in which a mass number of an element used in the insertion layer divided by the mass number of the sputtering gas itself is 2.2 or smaller.

Advantageous Effects of Invention

The present invention forms a magnetic tunnel junction element that includes a base layer for forming at least a reference layer, a barrier layer and a recording layer on one side thereof, wherein the reference layer, the barrier layer and the recording layer are formed by sputtering on one side of the base layer. During manufacture of the magnetic tunnel junction element, by performing the above-described film formation using sputtering gas having a close mass number as the insulation layer or the magnetic coupling layer formed of nonmagnetic body, the magnetic tunnel junction element according to the present invention enables to prevent the first ferromagnetic layer or the fixed layer from being damaged, and to prevent the TMR ratio from being deteriorated by diffusion of Ta and W. Therefore, the magnetic tunnel junction element according to the present invention realizes a high TMR ratio without causing damage to the fixed layer and the recording layer.

As described, the present invention enables to provide a magnetic tunnel junction element having a higher TMR ratio and capable of preventing damage to the recording layer during film formation, and a magnetic memory using the same.

DESCRIPTION OF EMBODIMENTS

Now, embodiments of the present invention will be described with reference to the drawings.

FIGS. 1 through 5 illustrate some examples related to a structure of a magnetic tunnel junction (MTJ) element according to the present invention.

Figure 1:
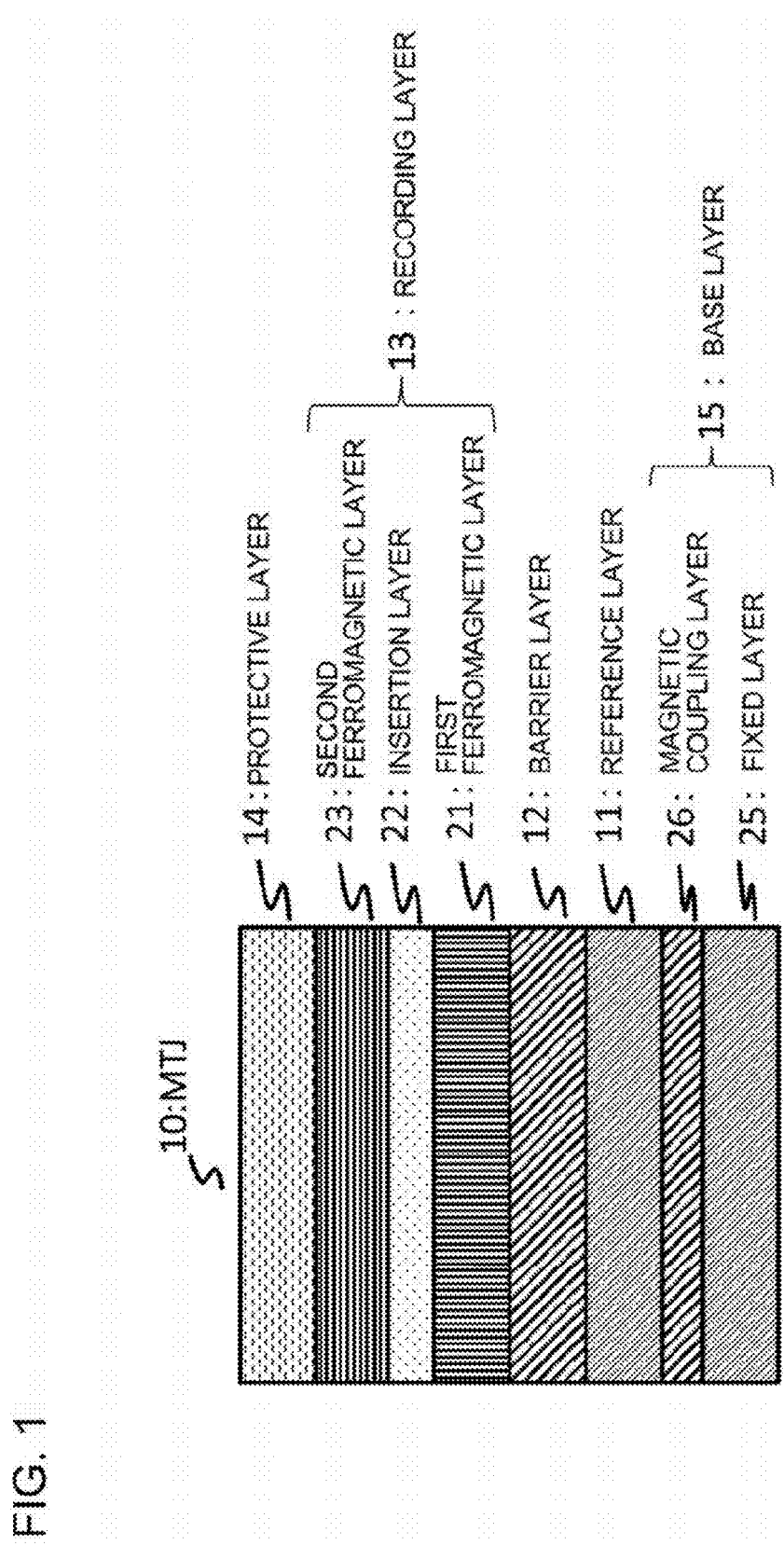
FIG. 1 is a cross-sectional view illustrating a magnetic tunnel junction element according to the present invention.
Figure 2:
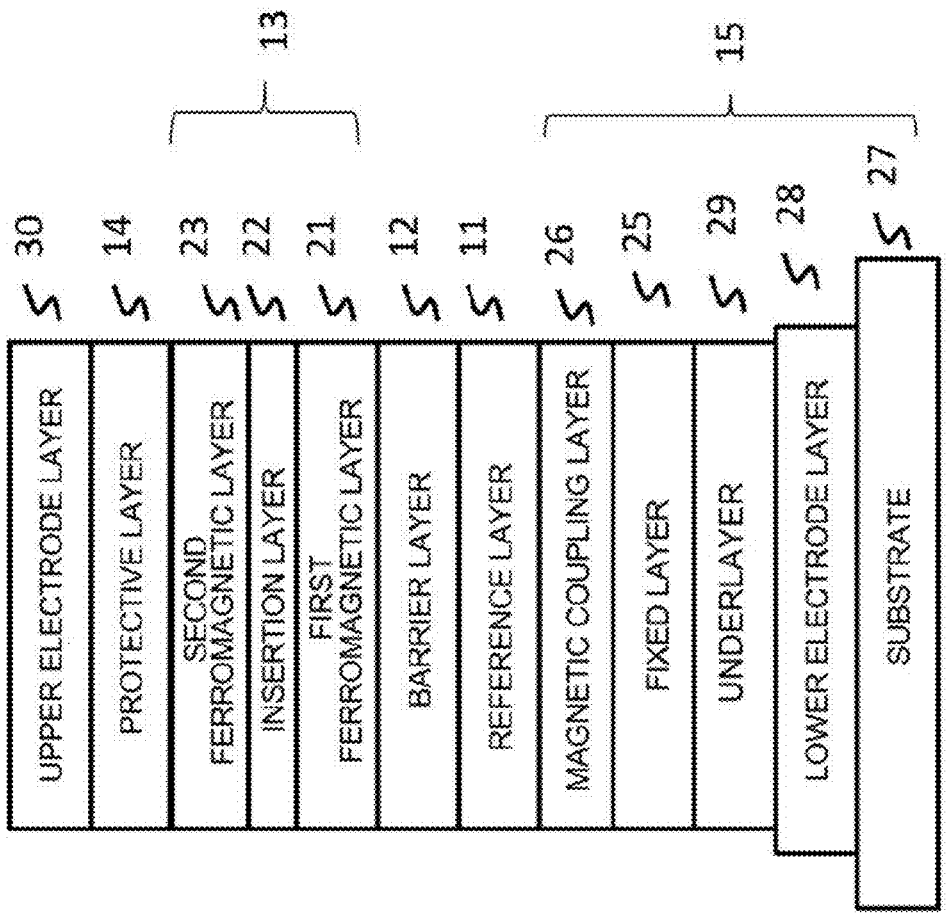
FIG. 2 is a cross-sectional view illustrating one example of an actual structure of the magnetic tunnel junction element according to the present invention.
Figure 3:
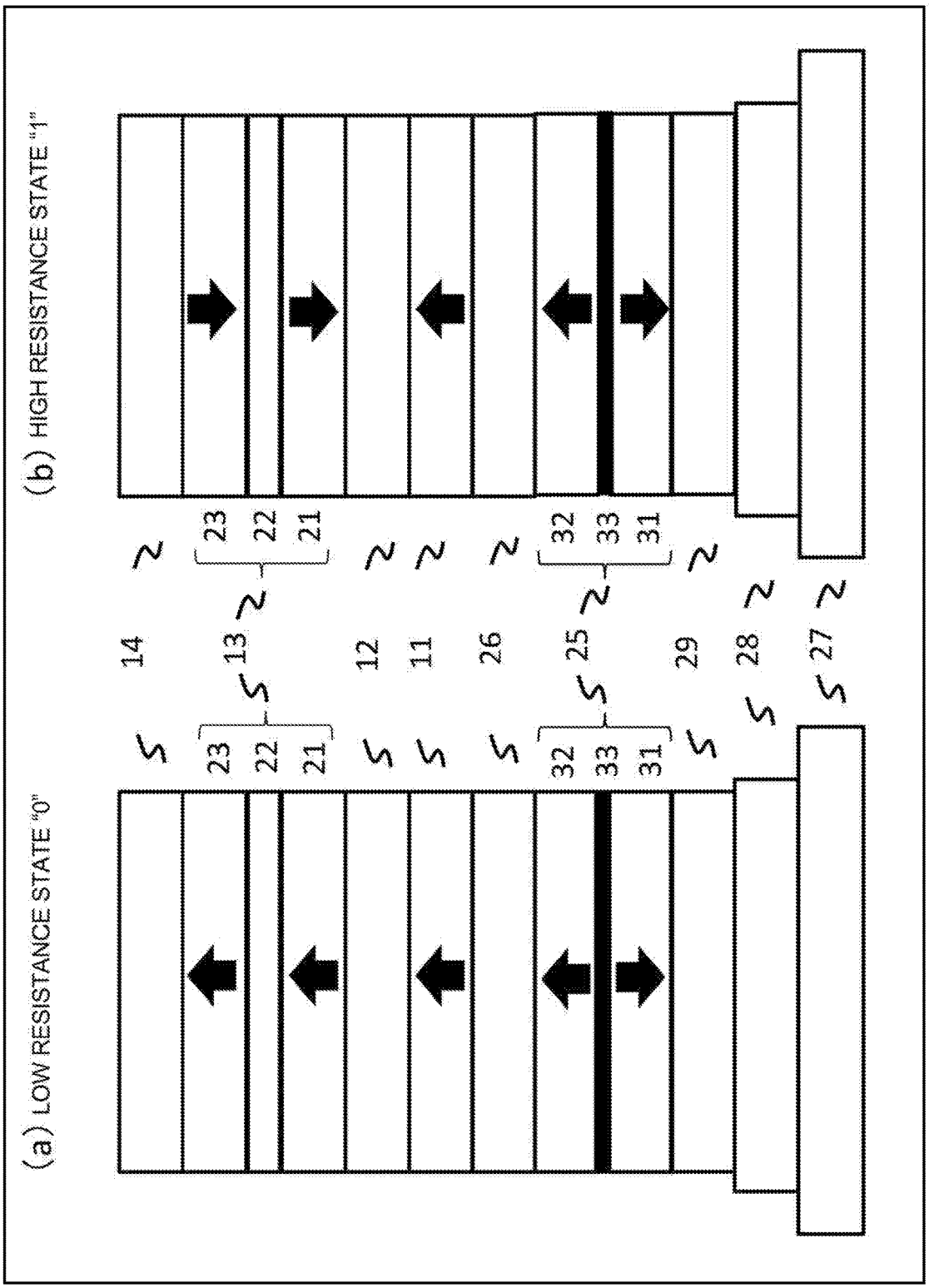
FIG. 3 is an explanatory view illustrating the magnetic tunnel junction element according to the present invention in (a) low resistance state and in (b) high resistance state.

Among these figures, in FIGS. 1 through 3, a magnetic tunnel junction element 10 includes a structure in which a reference layer 11, a barrier layer 12, a recording layer 13 and a protective layer 14 are stacked in the named order, and a base layer 15 on which the respective layers mentioned above are formed by sputtering and the like. Now, the respective layers will be described in order.

A fixed layer 25 constituting the base layer 15 is a ferromagnetic body in which a magnetization direction is fixed to a vertical direction with respect to a film surface.

A magnetic coupling layer 26 constituting the base layer 15 is a nonmagnetic body, and for example, it is a Ta film having a thickness of 0.4 nm. Other than Ta, the film can be formed of one of the following materials: Hf, W, Mo, Nb, Zr, Y, Sc, Ti, V and Cr.

The reference layer 11 is a ferromagnetic body in which the magnetization direction is fixed to a vertical direction with respect to the film surface, and for example, it is composed of a CoFeB film having a thickness of 1.0 to 12 nm.

The barrier layer 12 is a nonmagnetic body containing oxygen, and it is formed of an MgO film having a thickness of 1.0 to 1.3 nm, for example. The present invention is not limited to having oxygen contained in the nonmagnetic body.

The recording layer 13 adopts a structure in which a first ferromagnetic layer 21, an insertion layer 22 and a second ferromagnetic layer 23 are stacked in the named order. The first ferromagnetic layer 21 has a magnetization direction that is variable in the vertical direction with respect to the film surface, and for example, it is formed of a CoFeB film having a thickness of 1.4 to 1.5 nm.

The insertion layer 22 is formed of a nonmagnetic body, and for example, it is formed of a Ta or W film having a thickness of 0.2 to 0.5 nm. Other than Ta or W, similar to the magnetic coupling layer 26 described earlier, it can be a film formed of at least one of the following materials: Hf, Mo, Nb, Zr, Y, Sc, Ti, V and Cr.

The second ferromagnetic layer 23 has a magnetization direction that is variable in the vertical direction with respect to the film surface, and for example, it is formed of a CoFeB film having a thickness of 1.0 to 1.5 nm.

The first ferromagnetic layer 21 and the second ferromagnetic layer 23 are magnetically coupled via the insertion layer 22. Further, the barrier layer 12 can be arranged on any of the sides of the first ferromagnetic layer 21 and the second ferromagnetic layer 23 constituting the recording layer 13. FIG. 1 illustrates an actual example thereof, wherein the barrier layer 12 is arranged on a side of the first ferromagnetic layer 21.

The protective layer 14 is a nonmagnetic body containing oxygen, and for example, it is formed of a MgO film having a thickness of 1.0 to 1.1 nm. However, the present invention is not limited to having oxygen contained in the nonmagnetic body. Further, the protective layer 14 can be formed of a conductive oxide film. The following oxides can be used as the conductive oxide film, for example.

(1) Rutile—$MoO_2$ type oxides such as $RuO_2$, $VO_2$, $CrO_2$, $NbO_2$, $MoO_2$, $WO_2$, $ReO_2$, $RhO_2$, $OsO_2$, $IrO_2$, $PtO_2$, $V_3O_5$ and $Ti_3O_5$;

(2) NaCl type oxides such as TiO, VO, NbO, LaO, NdO, SmO, EuO, SrO, BaO and NiO;

(3) Spinel type oxides such as $LiTi_2O_4$, $LiV_2O_4$ and $Fe_3O_4$;

(4) Perovskite—$ReO_3$ type oxides such as $ReO_3$, $CaCrO_3$, $SrCrO_3$, $BaMoO_3$, $SrMoO_3$, $CaMoO_3$, $LaCuO_3$, $CaRuO_3$, $SrVO_3$ and $BaTO_3$;

(5) Corundum type oxides such as $Ti_2O_3$, $V_2O_3$ and $Rh_2O_3$;

(6) Oxide semiconductors such as ZnO, $TiO_2$, $SnO_2$, $Cu_2O$, $Ag_2O$, $In_2O_3$ and $WO_3$;

(7) $TaO_2$ etc.

In FIG. 1, the fixed layer 25 and the magnetic coupling layer 26 are provided as the base layer 15. Further, the base layer 15 is arranged on a side opposite from the side of the reference layer 11 having the barrier layer 12.

As illustrated in FIG. 3, the fixed layer 25 includes a third ferromagnetic layer 31, a fourth ferromagnetic layer 32, and a nonmagnetic layer 33 sandwiched therebetween.

The third ferromagnetic layer 31 is formed by stacking a Co film having a thickness of 0.5 nm and a Pt film having a thickness of 0.3 nm alternately for four times, and thereafter stacking a Co film having a thickness of 0.5 nm thereon.

The fourth ferromagnetic layer 32 is formed by stacking a Co film having a thickness of 0.5 nm and a Pt film having a thickness of 0.3 nm alternately for two times, and thereafter stacking a Co film having a thickness of 0.5 nm thereon.

The nonmagnetic layer 33 is formed of an Ru film having a thickness of 0.9 nm.

The fixed layer 25 is formed so that the magnetization directions of the third ferromagnetic layer 31 and the fourth ferromagnetic layer 32 are arranged in mutually opposing directions in the vertical direction with respect to the film surface through the nonmagnetic layer 33 by RKKY interaction.

The magnetic coupling layer 26 is a nonmagnetic body sandwiched between the fixed layer 25 and the reference layer 11, and it is formed of a Ta film having a thickness of 0.4 nm, for example.

Further, in the fixed layer 25, the fourth ferromagnetic layer 32 is arranged to be in contact with the magnetic coupling layer 26.

Further, the reference layer 11 is magnetically coupled via the magnetic coupling layer 26 to the fixed layer 25, and the magnetization direction is fixed in one direction in the vertical direction with respect to the film surface.

In the magnetic tunnel junction element 10, a magnetic tunnel junction is created via the barrier layer 12 between the reference layer 11 and the recording layer 13. Further, as illustrated in FIG. 1, the magnetic tunnel junction element 10 has a double interface structure in which the recording layer 13 is sandwiched between the barrier layer 12 and the protective layer 14, so that the first ferromagnetic layer 21 contacts the barrier layer 12 and the second ferromagnetic layer 23 contacts the protective layer 14. Thereby, perpendicular magnetic anisotropy occurs respectively at the interface between the first ferromagnetic layer 21 and the barrier layer 12 and the interface between the second ferromagnetic layer 23 and the protective layer 14 of the magnetic tunnel junction element 10, and the magnetization direction of the first ferromagnetic layer 21 and the second ferromagnetic layer 23 is perpendicular with respect to the film surface. Further according to the magnetic tunnel junction element 10, the magnetization direction of the first ferromagnetic layer 21 and the second ferromagnetic layer 23 is formed to change by spin-injection magnetization reversal.

The magnetic tunnel junction element 10 can be manufactured by forming, on the base layer 15, the reference layer 11, the barrier layer 12, the first ferromagnetic layer 21, the insertion layer 22, the second ferromagnetic layer 23 and the protective layer 14 in the named order, and thereafter performing heat treatment. Sputtering, which is a physical vapor deposition method, or a molecular beam epitaxial growth method (MBE method), can be used as the method for deposition of the respective layers. The temperature of heat treatment should preferably be 350 to 450° C.

Actually, the magnetic tunnel junction element 10 has a structure in which, as illustrated in FIG. 2, for example, a lower electrode layer 28 and an underlayer 29 are formed on a substrate 27, and on the underlayer 29 are stacked the fixed layer 25, the magnetic coupling layer 26, the reference layer 11, the barrier layer 12, the first ferromagnetic layer 21, the insertion layer 22, the second ferromagnetic layer 23, the protective layer 14 and an upper electrode layer 30. Similarly, the element 10 can be manufactured by forming the respective layers on the substrate 27 and performing heat treatment thereafter. In FIG. 2, the substrate 27, the lower electrode layer 28, the underlayer 29, the fixed layer 25 and the magnetic coupling layer 26 constitute the base layer 15.

In the present example, the substrate 27 is configured to include a transistor and multiple wiring layers.

The lower electrode layer 28 is a conductive layer having a thickness of approximately 20 to 50 nm, and it is formed of a metal material such as Ta, TaN, Ti, TiN, Cu CuN, Au, Ag and Ru or alloys thereof. Further, the lower electrode layer 28 can adopt a structure in which a plurality of metal materials are stacked, such as a Ta/Ru/Ta structure. The lower electrode layer 28 is a layer serving as a foundation for forming the respective layers to be disposed above, and after being formed, the surface thereof is flattened by chemical-mechanical planarization (CMP), or gas duster ion beams (GCIB), for example.

The underlayer 29 is formed of a Ta film with a thickness of approximately 5 nm, for example. The underlayer 29 can be formed of a metal material other than Ta, such as Pt, Cu, CuN, Au, Ag, Ru and Hf or alloys thereof. Further, the underlayer 29 can adopt a structure in which a plurality of metal materials are stacked, such as a Ta/Pt structure.

The upper electrode layer 30 is a conductive layer having a thickness of approximately 10 to 100 nm and formed of a metal material such as Ta, TaN, Ti, TiN, Cu, CuN, Au, Ag and Ru or an alloy thereof. Further, the upper electrode layer 30 can adopt a structure where a plurality of metal materials are stacked, such as a Ta/Ru structure.

Next, the effect will be described.

The magnetic tunnel junction element 10 has the insertion layer 22 containing Ta or W as the recording layer 13 inserted between the first ferromagnetic layer 21 and the second ferromagnetic layer 23, so that by heat treatment during manufacture, boron (B) contained in the first ferromagnetic layer 21 and the second ferromagnetic layer 23 is absorbed by the insertion layer 22 and crystallization of the first ferromagnetic layer 21 and the second ferromagnetic layer 23 is promoted, by which the TMR ratio can be increased.

Further according to the magnetic tunnel junction element 10, during manufacture, the insertion layer 22 formed of Ta or W is formed using a sputtering gas having a mass number close to the mass number of this nonmagnetic layer, so that it becomes possible to prevent Ta or W colliding against and being implanted in the first ferromagnetic layer 21. Thereby, it becomes possible to prevent the first ferromagnetic layer 21 from being damaged and the recording layer 13 from being damaged.

Further, since Ta or W is not implanted in the first ferromagnetic layer 21, it becomes possible to prevent Ta and W from being diffused into the first ferromagnetic layer 21 by heat treatment performed during manufacture. Thereby, it becomes possible to prevent the TMR ratio from being deteriorated and also raise the temperature of heat treatment.

As described, the magnetic tunnel junction element 10 realizes a high TMR ratio without causing damage to the recording layer 13. The manufacturing method by the film formation described above will be described in further detail in first and second embodiments described later.

Further, since the magnetic tunnel junction element 10 has a double interface structure and perpendicular magnetic anisotropy is generated at each of the two interfaces of the recording layer 13, the film thickness of the recording layer 13 can be increased and thermal stability can be enhanced.

In the magnetic tunnel junction element 10, as illustrated in FIG. 3A, if the magnetization direction of the reference layer 11 and the magnetization direction of the recording layer 13 are mutually in parallel and in the same direction (P state), low resistance is realized between the lower electrode layer 28 and the upper electrode layer 30. Meanwhile, as illustrated in FIG. 3B, if the magnetization direction of the reference layer 11 and the magnetization direction of the recording layer 13 are antiparallel (parallel and in opposite directions: AP state), high resistance is realized between the lower electrode layer 28 and the upper electrode layer 30. Information can be written by setting the high and low of the resistance value to correspond to 0 and 1 of the bit information. In the example illustrated in FIG. 3, "0" is assigned to the low resistance state and "1" is assigned to the high resistance state.

In order to write information in the magnetic tunnel junction element 10, "0" or "1" can be written by changing the direction of write current flown between the lower electrode layer 28 and the upper electrode layer 30. If write current is flown from the upper electrode layer 30 to the lower electrode layer 28, as illustrated in FIG. 3A, magnetization of the recording layer 13 and magnetization of the reference layer 11 will be in the same direction, so that "0" is written. Meanwhile, if write current is flown from the lower electrode layer 28 to the upper electrode layer 30, as illustrate in FIG. 3B, magnetization of the recording layer 13 and magnetization of the reference layer 11 will be in opposite directions, so that "1" is written.

Next, in order to read information from the magnetic tunnel junction element 10, readout voltage is applied between the lower electrode layer 28 and the upper electrode layer 30, by which current corresponding to resistance value of "0" or "1" is flown. By detecting this current, information written in the magnetic tunnel junction element 10 ("0" or "1") can be read.

Figure 4:
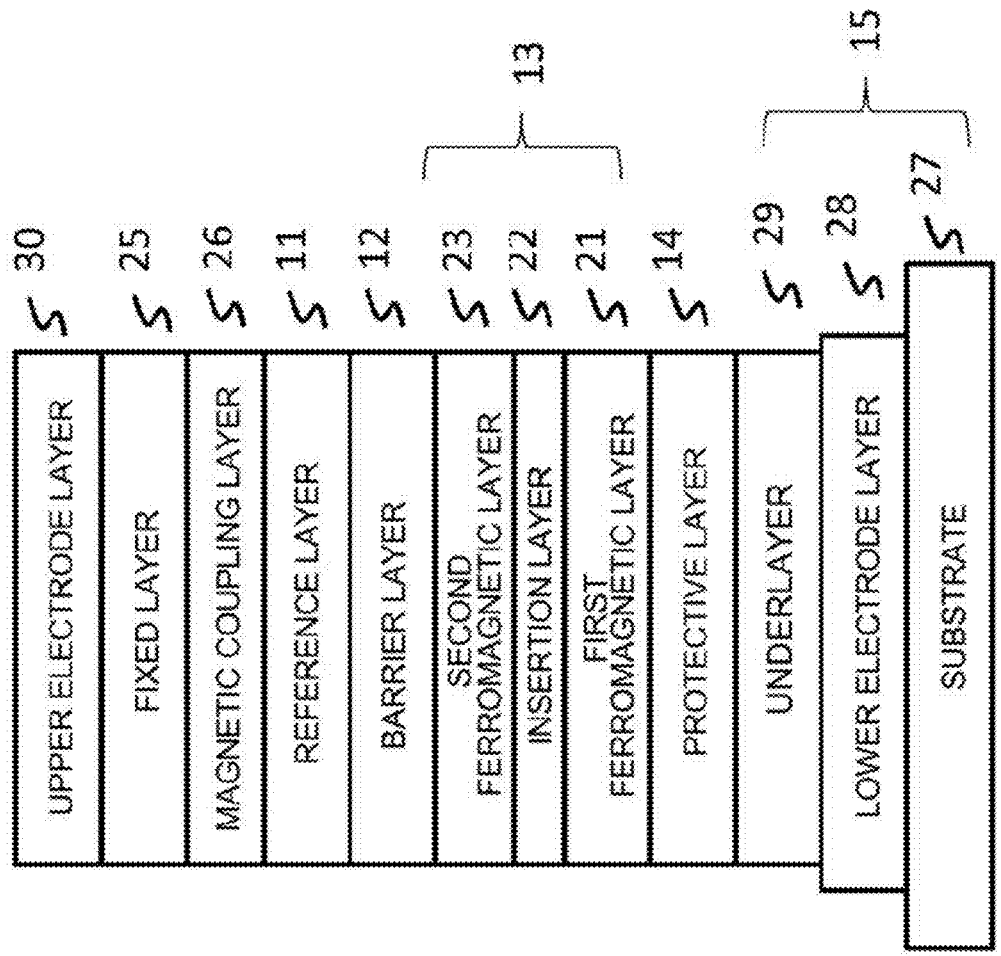
FIG. 4 is a cross-sectional view illustrating a first modified example of a magnetic tunnel junction element according to the present invention.

As for the configuration of the magnetic tunnel junction element 10, as illustrated in FIG. 4, a configuration in which the order of layers is reversed from the fixed layer 25 to the protective layer 14 can be adopted. In this case, the underlayer 29 and the protective layer 14 are in contact, and the fixed layer 25 and the upper electrode layer 30 are in contact. Further, the substrate 27, the lower electrode layer 28 and the underlayer 29 constitute the base layer 15.

Figure 5:
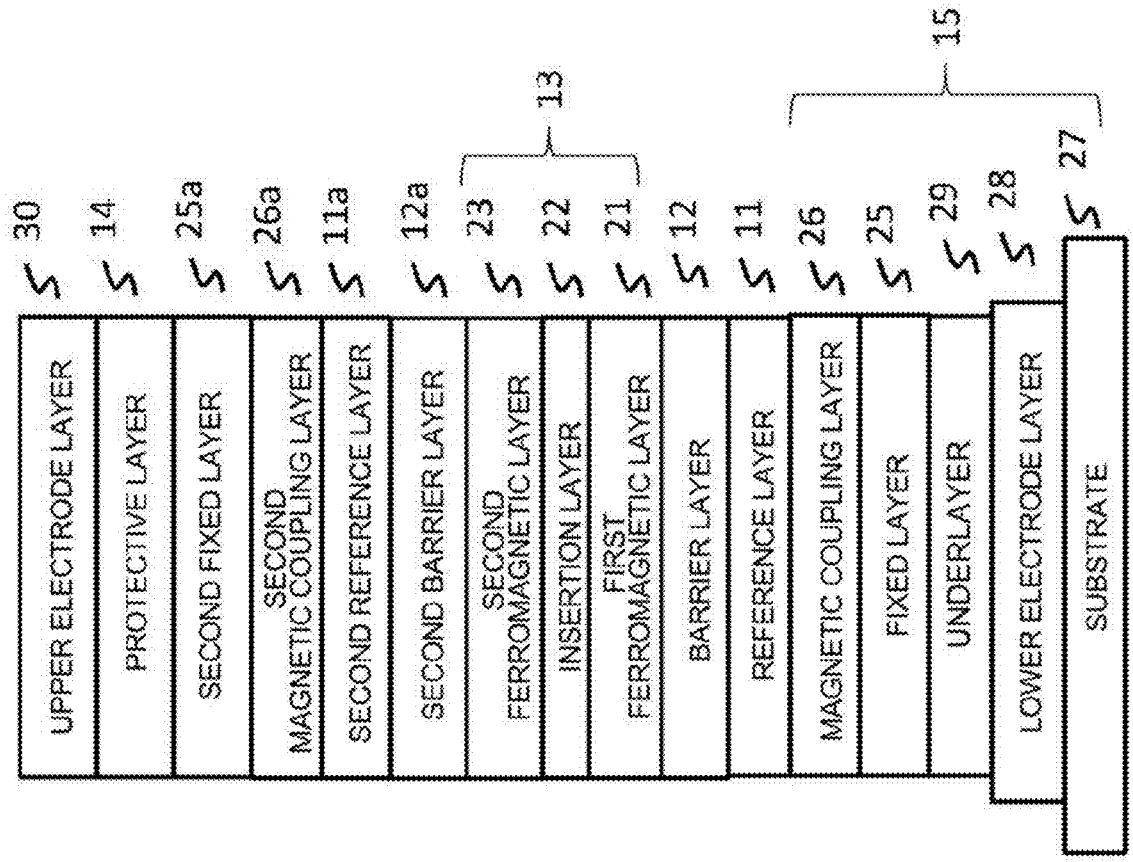
FIG. 5 is a cross-sectional view illustrating a second modified example of a magnetic tunnel junction element according to the present invention.

As another configuration of the magnetic tunnel junction element 10, as illustrated in FIG. 5, a configuration can be adopted where a second barrier layer 12a, a second reference layer 11a, a second magnetic coupling layer 26a an a second fixed layer 25a are inserted between the recording layer 13 and the protective layer 14 and stacked, in the named order, from the side of the recording layer 13.

Figure 6:
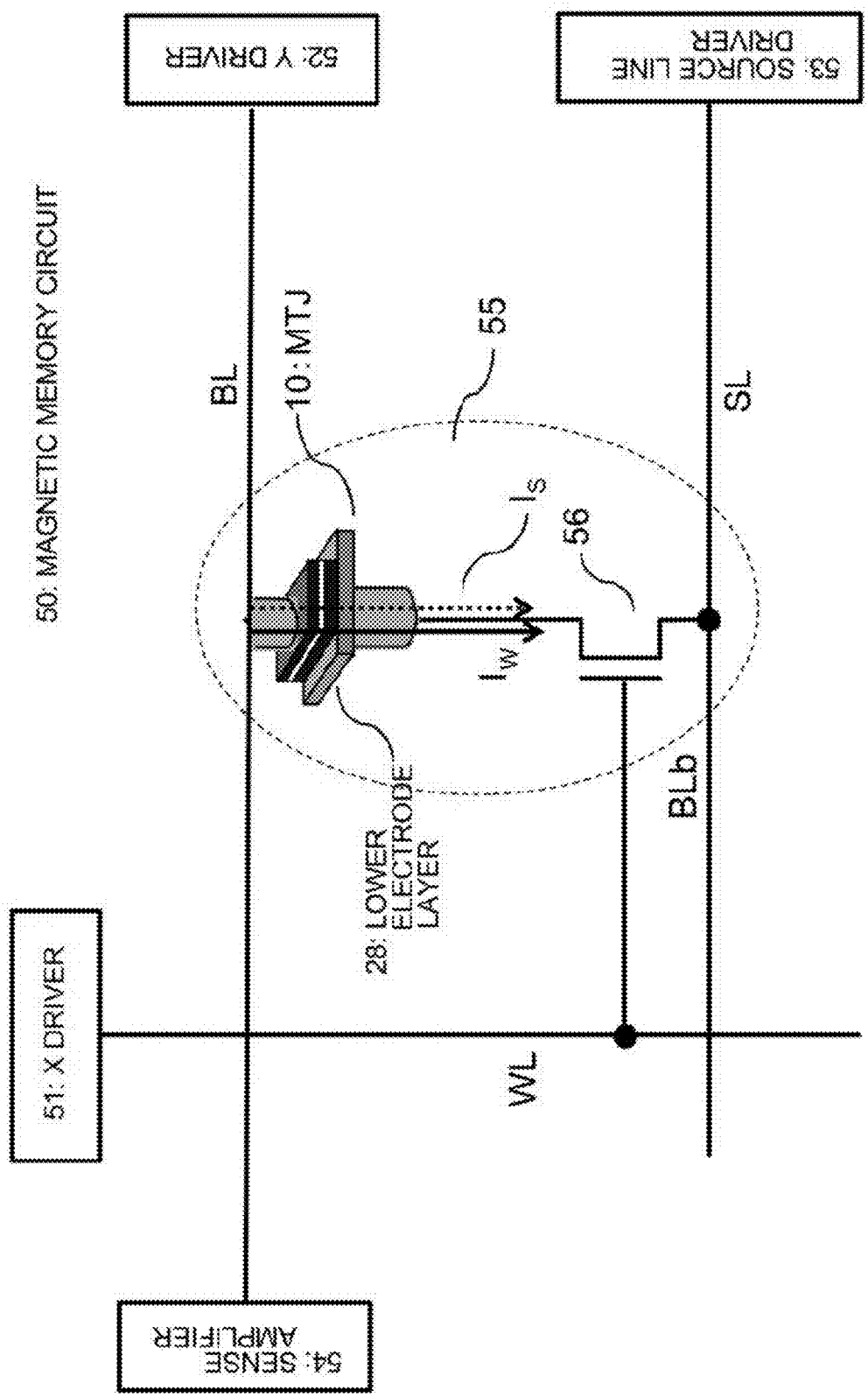
FIG. 6 is a block circuit diagram illustrating a magnetic memory using the magnetic tunnel junction element according to the present invention.

FIG. 6 is a configuration of a magnetic memory circuit using the magnetic tunnel junction element 10 according to the present invention.

As illustrated in FIG. 6, a magnetic memory circuit 50 includes a source line SL, a word line WL, a bit line BL, an X driver (word line WL driver) 51, a Y driver (bit line BL driver) 52, a source line driver 53, a sense amplifier 54 and a storage cell 55.

There are multiple source lines SL which are arranged in parallel. There are multiple word lines WL which are mutually arranged in parallel in directions intersecting the respective source lines SL. There are multiple bit lines BL which are arranged in parallel with the respective source lines SL. The respective source lines SL and the respective word lines WL, and the respective word lines WL and the respective bit lines BL, are not directly connected electrically.

The X driver 51 is connected to each word line WL, the Y driver 52 is connected to each bit line BL, and the source line driver 53 is connected to each source line SL. Further, the sense amplifier 54 is connected to each bit line BL.

There are multiple storage cells 55, wherein respective word lines WL and respective bit lines BL are arranged close to the intersecting position and in a matrix. The respective storage cells 55 can each store one bit of data, and each storage cell 55 includes a selection transistor 56 and the magnetic tunnel junction element 10. The selection transistor 56 has its gate electrode electrically connected to one of the word lines WL and its source electrode electrically connected to one of the source lines SL. In the magnetic tunnel junction element 10, the lower electrode layer 28 is electrically connected to a drain electrode of the selection transistor 56, and the upper electrode layer 30 is electrically connected to one of the bit lines BL.

In the respective storage cells 55, the combination of the electrically connected word line WL, bit line BL and source line SL differ. The magnetic memory circuit 50 is capable of applying current to the vertical direction with respect to the film surface of the magnetic tunnel junction element 10 of the respective storage cells 55 through the bit line BL and the source line SL.

In the magnetic memory circuit 50, the X driver 51, the Y driver 52 and the source line driver 53 function as a writing unit configured to write data to a selected storage cell 55 through respective word lines WL, respective bit lines BL and respective source lines SL. Further, the X driver 51, the sense amplifier 54 and the source line driver 53 function as a reading unit configured to select one storage cell 55 and read data therefrom through the respective word lines WL, respective bit lines BL and respective source lines SL.

Next, an aspect in which the magnetic memory circuit 50 writes information to the magnetic tunnel junction element 10 will be described. The X driver 51 controls voltage of the word line WL connected to the magnetic tunnel junction element 10 as the write target and turns on the corresponding selection transistor 56. Then, the Y driver 52 and the source line driver 53 adjusts the voltage applied between the bit line BL and the source line SL connected to the magnetic tunnel junction element 10 being the write target, and thereby controls the direction and size of write current Iw flown through the magnetic tunnel junction element 10. Thereby, desired information ("0" or "1") is written through spin-injection magnetization reversal.

Further, an aspect in which the magnetic memory circuit 50 reads information from the magnetic tunnel junction element 10 will be described. The X driver 51 applies selection voltage to the word line WL and turns on the selection transistor 56 connected to the magnetic tunnel junction element 10 being the read target Next, the Y driver 52 and the source line driver 53 apply readout voltage between the bit line BL and the source line SL connected to the magnetic tunnel junction element 10 being the read target. Thereby, current corresponding to a resistance value of information ("0" or "1") written in the magnetic tunnel junction element 10 is flown. The sense amplifier 54 can read information written therein by converting current to voltage.

The magnetic memory circuit 50 can realize high speed reading since it has a magnetic tunnel junction element 10 with a high TMR ratio, that is, high readout signal.

Next, a case where the magnetic coupling layer is formed using sputtering gas whose mass number is closer to the mass number of a nonmagnetic body constituting the magnetic coupling layer and a case where the insertion layer of the recording layer is formed using sputtering gas whose mass number is closer to the mass number of a nonmagnetic body constituting the insertion layer are described as examples 1 and 2 of the manufacturing methods according to the present invention.

Example 1

Figure 7:
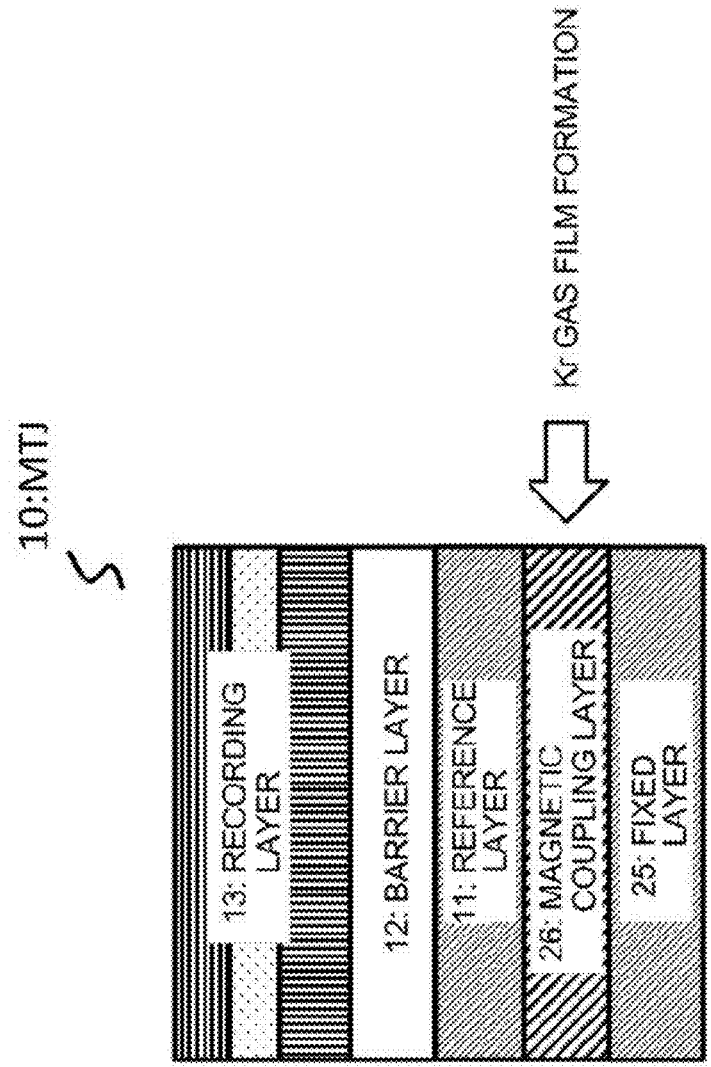
FIG. 7 is a view illustrating a configuration where a magnetic coupling layer is formed through Kr gas film formation using Kr as sputtering gas according to example 1 of a manufacturing method according to the present invention.

FIG. 7 is a view of a configuration according to example 1 of the manufacturing method according to the present invention, wherein the magnetic coupling layer 26 is formed by Kr gas film formation in which krypton (Kr) is used instead of the conventional argon (Ar) as sputtering gas.

Further, for comparison, measurement of magnetic characteristics of the magnetic tunnel junction element 10 is performed of a case where argon (Ar) and krypton (Kr) are used as sputtering gas for forming the magnetic coupling layer.

Now, the magnetic tunnel junction element 10 is a stacked body as illustrated in FIGS. 1 through 3 and described above, and the magnetic coupling layer is formed, as described above, of a film composed of at least one of the following nonmagnetic bodies of Ta, Hf, W, Mo, Nb, Zr, Y, Sc, Ti, V and Cr, whereas in example 1, the tungsten (W) is set as target to be formed by the sputtering gas. Further, the fixed layer 25 immediately below the magnetic coupling layer 26 is a stacked body formed of Co film and Pt film, and the reference layer 11 immediately above the magnetic coupling layer 26 is formed as a CoFeB film (refer to FIGS. 9 and 10 described later). The magnetic tunnel junction element 10 is formed by stacking the respective layers and thereafter performing heat treatment for one hour at 400° C.

Figure 8:
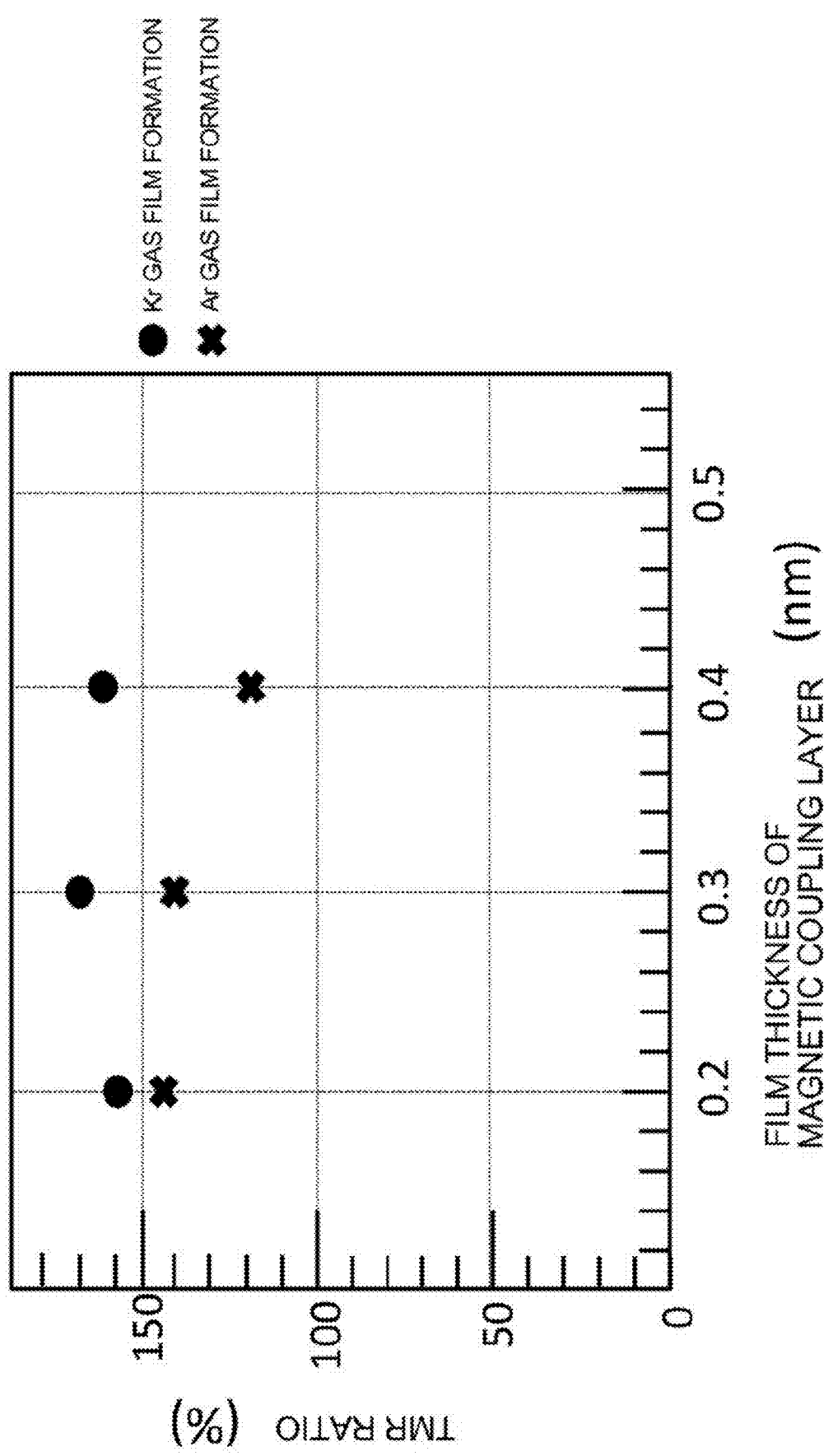
FIG. 8 is a view illustrating a dependency of TMR ratio value to a magnetic coupling layer film thickness in a case where W of the magnetic coupling layer is sputtered using Ar and Kr according to example 1.

The respective TMR ratios of each MTJ of a case where the magnetic coupling layer was sputtered by Kr, that is, where Kr gas film formation was performed, and of a case where it was sputtered by Ar, that is, where Ar gas film formation was performed, measured according to film thicknesses of the magnetic coupling layer are illustrated in Table 1, and a characteristics graph is illustrated in FIG. 8.

TABLE 1

| | FILM THICKNESS OF MAGNETIC COUPLING LAYER (nm) | | |
|---|---|---|---|
| | 0.2 | 0.3 | 0.4 |
| FILM FORMATION with Kr | 159% | 170% | 162% |
| FILM FORMATION with Ar | 146% | 140% | 120% |

As illustrated in FIG. 8, the TMR ratio of MTJ in a case where the magnetic coupling layer was sputtered using Kr was improved by 10% to 30% within a magnetic coupling layer film thickness from 02 nm to 0.4 nm compared to the TMR ratio of the MT in a case where the magnetic coupling layer was sputtered using Ar, and a result showing high values was acquired for al magnetic coupling layer film thicknesses.

The following is considered as the cause for such improvement of TMR ratio and perpendicular magnetic anisotropy. At first, the relationship between elements used as sputtering gas and target and the mass numbers thereof is illustrated in Table 2.

TABLE 2

| ELEMENT | MASS NUMBER |
|---|---|
| ARGON (Ar) | 40 |
| KRYPTON (Kr) | 84 |
| XENON (Xe) | 131 |
| TANTALUM (Ta) | 180 |
| RUTHENIUM (Ru) | 101 |
| PLATINUM (Pt) | 195 |
| TUNGSTEN (W) | 183 |
| TITANIUM (Ti) | 47 |
| COBALT (Co) | 58 |
| IRON (Fe) | 55 |

Energy (E) of sputtering gas recoiled from the target during sputtering is determined by difference of mass numbers of the target and the sputter gas (Mt−Mg).

$E \propto M_t - M_g$ wherein E: energy of sputtering gas (atoms) being recoiled
Mt: mass number of target
Mg: mass number of sputtering gas For example, in a case where the target is tungsten (W) and the sputtering gas is argon (Ar), the respective mass numbers are 183 for W and 43 for Ar, as shown in Table 2, so that the ratio of mass number of W to the mass number of Ar (=W/Ar) is approximately 4.6. Meanwhile, if the sputtering gas is krypton (Kr), the mass number of Kr is 84 from Table 2, so that the ratio of mass number of W to the mass number of Kr (=W/Kr) is approximately 2.2, which is approximately half the case of Ar.

Therefore, the energy of sputtering gas being recoiled is approximately half in film deposition with Kr compared to film deposition with Ar.

Now, comparison of damage caused to the lower layer by recoiled sputtering gas is described with reference to FIG. 9. As illustrated in the left drawing of FIG. 9, if Ar having a small mass number is used as sputtering gas, the sputtering gas collides against the sputtering target and the recoiled Ar bombarded the sputtering film surface, so that the recoiled Ar will enter the film. As a result, in the case of film deposition using Ar sputtering gas, the recoiled Ar damages the fixed layer underneath the W layer. The effect of such damage increases as the difference between mass numbers of the target and the sputtering gas increases.

Figure 9:
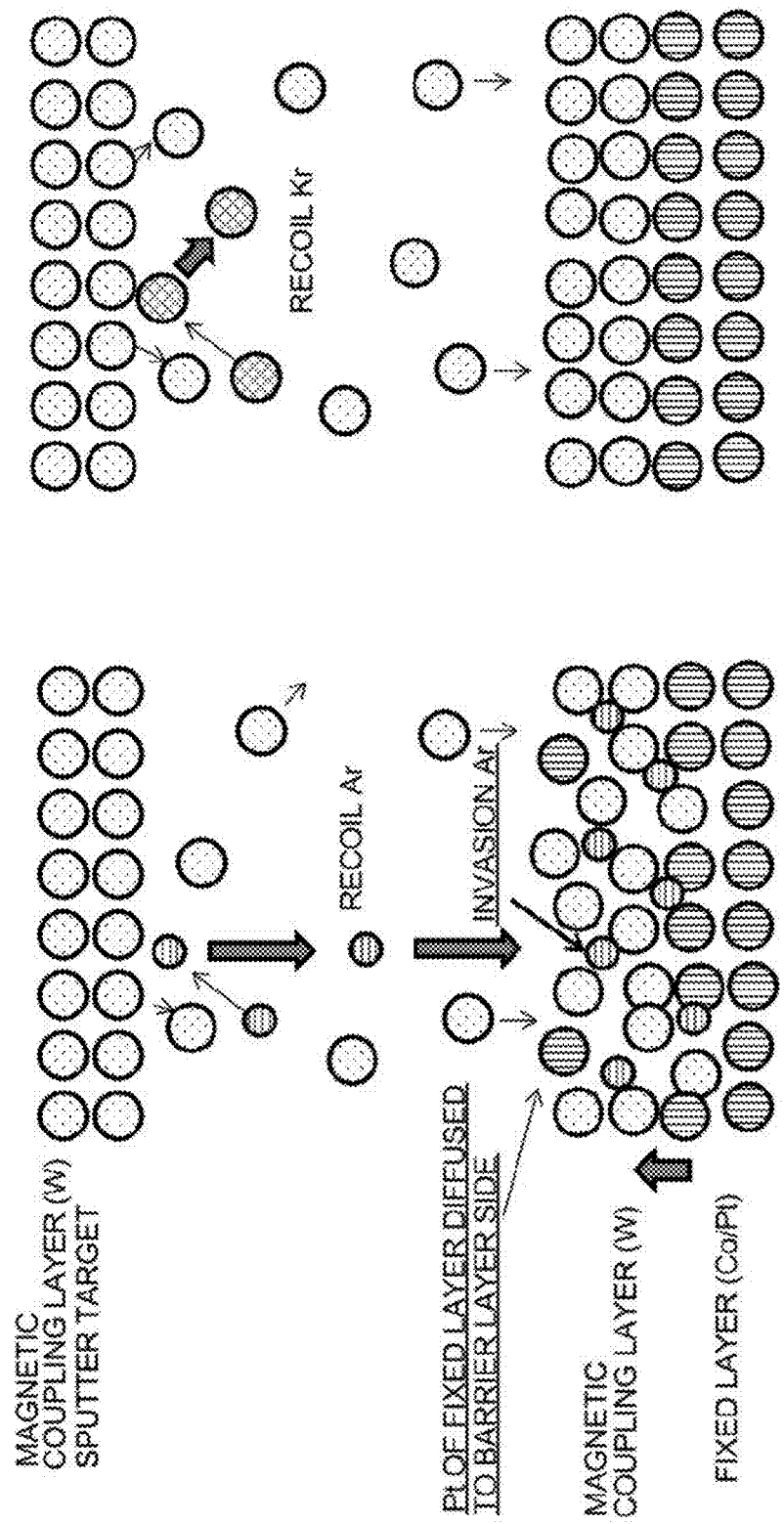
FIG. 9 is a cross-sectional image illustrating damage caused to a fixed layer in a case where W of the magnetic coupling layer is formed using Ar gas and Kr gas according to example 1.

Meanwhile, in a case where film deposition is performed using Kr as sputtering gas, the difference between the mass numbers of W as target and Kr as sputtering gas becomes smaller than the case where Ar is used as sputtering gas, the energy of recoiled Kr becomes smaller, such that Kr does not enter the film, as illustrated in the right drawing of FIG. 9. Therefore, it is considered that the fixed layer underneath W layer is not damaged by W film deposition with Kr, and damaging of the fixed layer can be prevented. Furthermore, the reduction of magnetic coupling between the reference layer (CoFeB) and the fixed layer (Co/Pt) can be suppressed.

Since material such as W is not implanted to the fixed layer during W film formation with Kr, a phenomenon where atoms such as Pt in the fixed layer being diffused to the inner side of the reference layer on the barrier (barrier layer) side during film deposition with Ar by thermal budget during manufacture does not occur, and diffusion to the inner side of the reference layer can be prevented.

Figure 10:
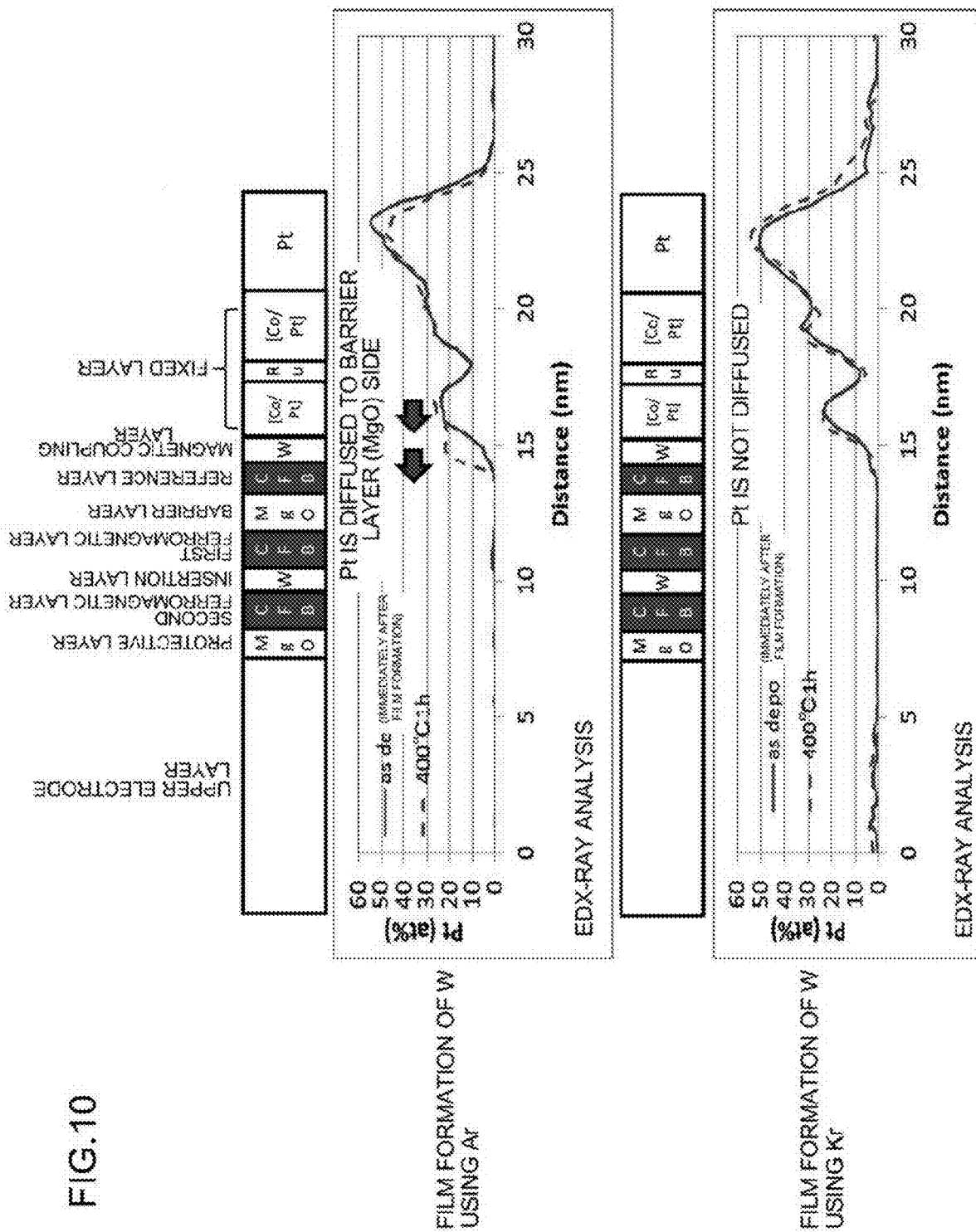
FIG. 10 is a view illustrating a result of subjecting the cross-section of MTJ to EDX-ray analysis in a case where W of the magnetic coupling layer is formed using Ar gas and Kr gas according to example 1.

This effect can be confirmed from the EDX-ray (energy dispersion type X-ray) analysis. FIG. 10 illustrates a result of executing EDX-ray analysis respectively to a state immediately after film formation (as depo) and in a state where heat treatment has been performed for one hour at 400° C. in the case of W film formation with Ar and in the case of W film formation with Kr. In the case of film formation with Ar, a result is shown where the Pt atoms as component of the fixed layer is diffused to the reference layer on the barrier (barrier layer MgO) side (where Pt is diffused in the direction of the arrow by heat treatment), whereas such phenomenon of diffusion of Pt is not seen in the case of film formation with Kr, and thereby, deterioration of perpendicular magnetic anisotropy can be prevented.

As described, it is considered that deterioration of TMR ratio and perpendicular magnetic anisotropy can be prevented by film deposition with Kr and the result illustrated in FIG. 8 could be achieved thereby.

Example 2

Figure 11:
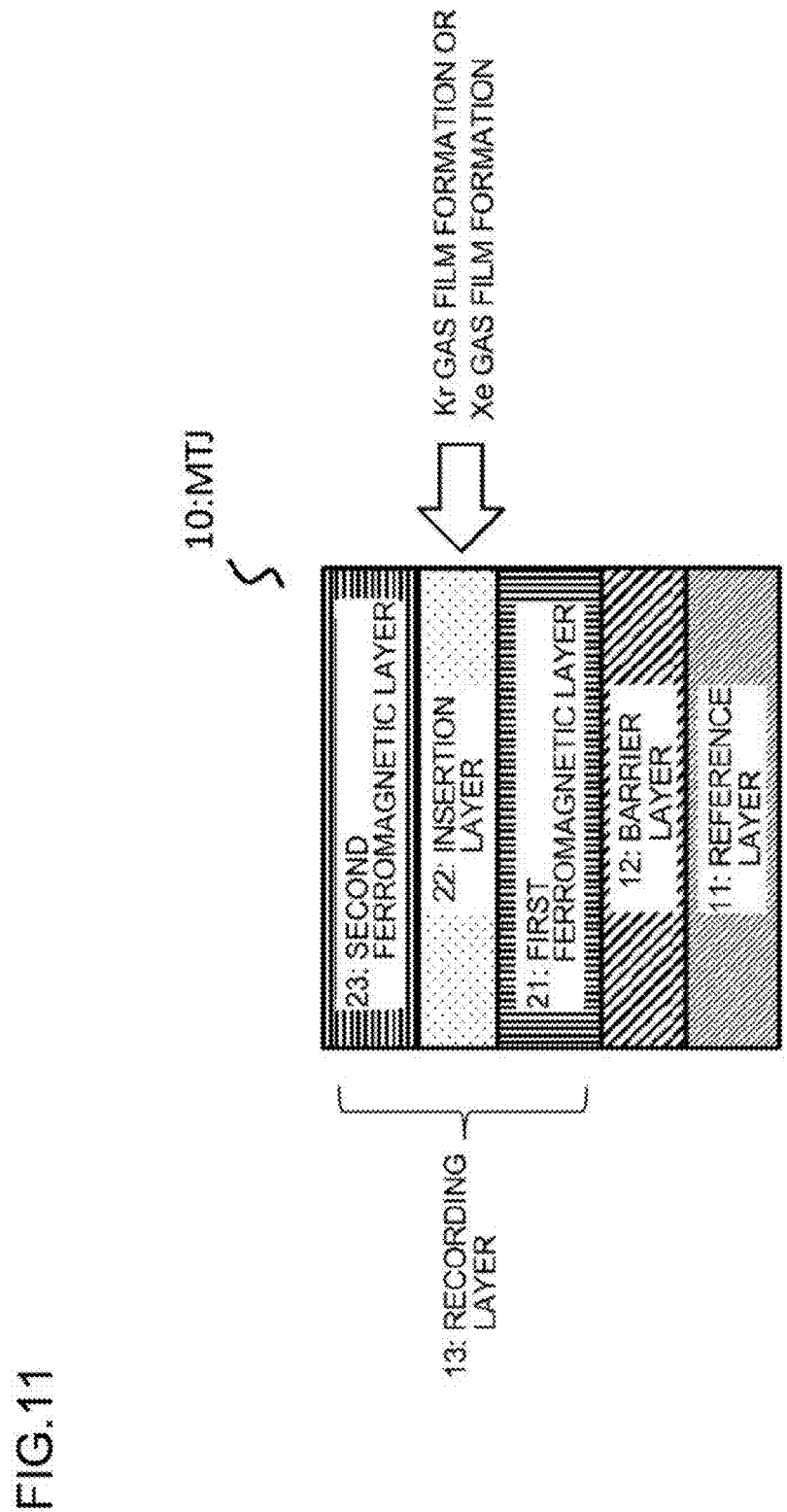
FIG. 11 is a view illustrating a configuration where Kr gas film formation or Xe gas film formation is performed to form an insertion layer using Kr or Xe as sputtering gas according to example 2 of the manufacturing method according to the present invention.

FIG. 11 illustrates example 2 of the manufacturing method according to the present invention, illustrating a configuration where the insertion layer 22 sandwiched between the first ferromagnetic layer 21 and the second ferromagnetic layer 23 constituting the recording layer 13 is formed by Kr gas film formation or Xe gas film formation using krypton (Kr) or xenon (Xe) in replacement of prior art argon (Ar) as sputtering gas.

For comparison, magnetic characteristics of the magnetic tunnel junction element 10 was measured for cases where these three gases were used and a case where argon (Ar) was used as the sputtering gas for forming the insertion layer 22.

The magnetic tunnel junction element 10 is formed to have the stacked body illustrated in FIGS. 1 through 3 and described above, and the insertion layer 22 is formed of a Ta or W film formed of a nonmagnetic body as described above, whereas in example 2, tungsten (W) is set as the target to be formed using sputtering gas. The first ferromagnetic layer 21 immediately below the insertion layer 22 is set as the CoFeB film (refer to FIG. 13 described later). The magnetic tunnel junction element 10 was manufactured by performing heat treatment for one hour at 400° C. after forming the respective layers.

Figure 12:
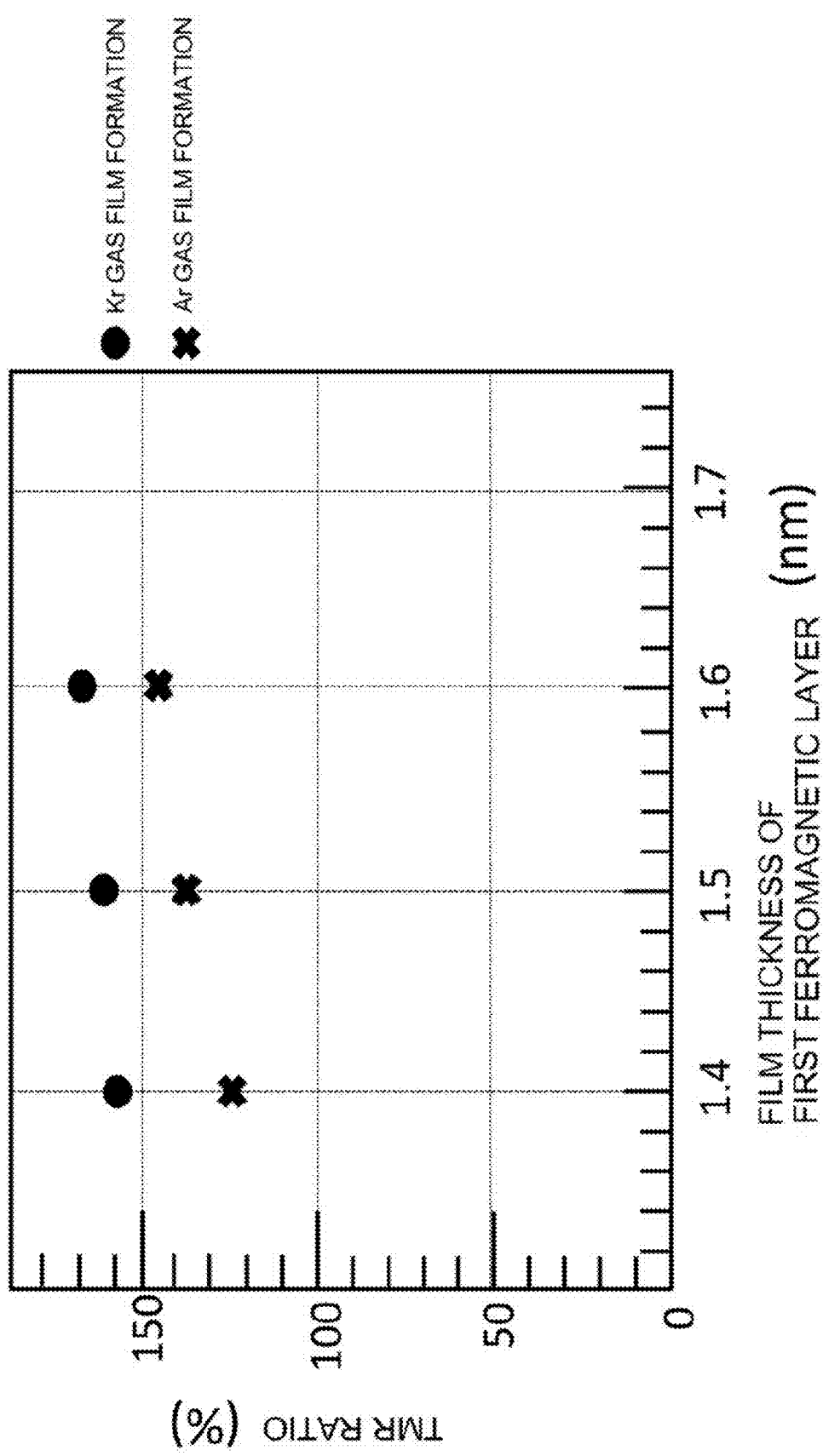
FIG. 12 is a view illustrating a dependency of TMR ratio value to film thickness of first ferromagnetic layer in a case where W of the insertion layer is sputtered using Ar and Kr according to example 2.

The values of respective TMR ratio of MTJ measured for cases where the insertion layer 22 was sputtered by Kr, that is, formed by Kr gas film formation, and sputtered by Ar, that is, formed by Ar gas film formation, measured for cases where the film thicknesses of the first ferromagnetic layer were 1.4 nm to 1.6 nm are illustrated in Table 3, and the characteristics graph thereof is illustrate in FIG. 12.

TABLE 3

|  | FILM THICKNESS OF FIRST FERROMAGNETIC LAYER (nm) | | |
| --- | --- | --- | --- |
|  | 1.4 | 1.5 | 1.6 |
| FILM FORMATION with Kr | 162% | 165% | 170% |
| FILM FORMATION with Ar | 125% | 135% | 145% |

As illustrated in FIG. 12, the TMR ratio of MTJ in the case where the insertion layer was sputtered by Kr had been improved by 20% to 30% for film thicknesses of 1.4 nm to 1.6 nm of the first ferromagnetic layer compared to the TMR ratio of the MTJ where the insertion layer was sputtered by Ar, and good results have been acquired for all film thicknesses of the first ferromagnetic layer.

Figure 13:
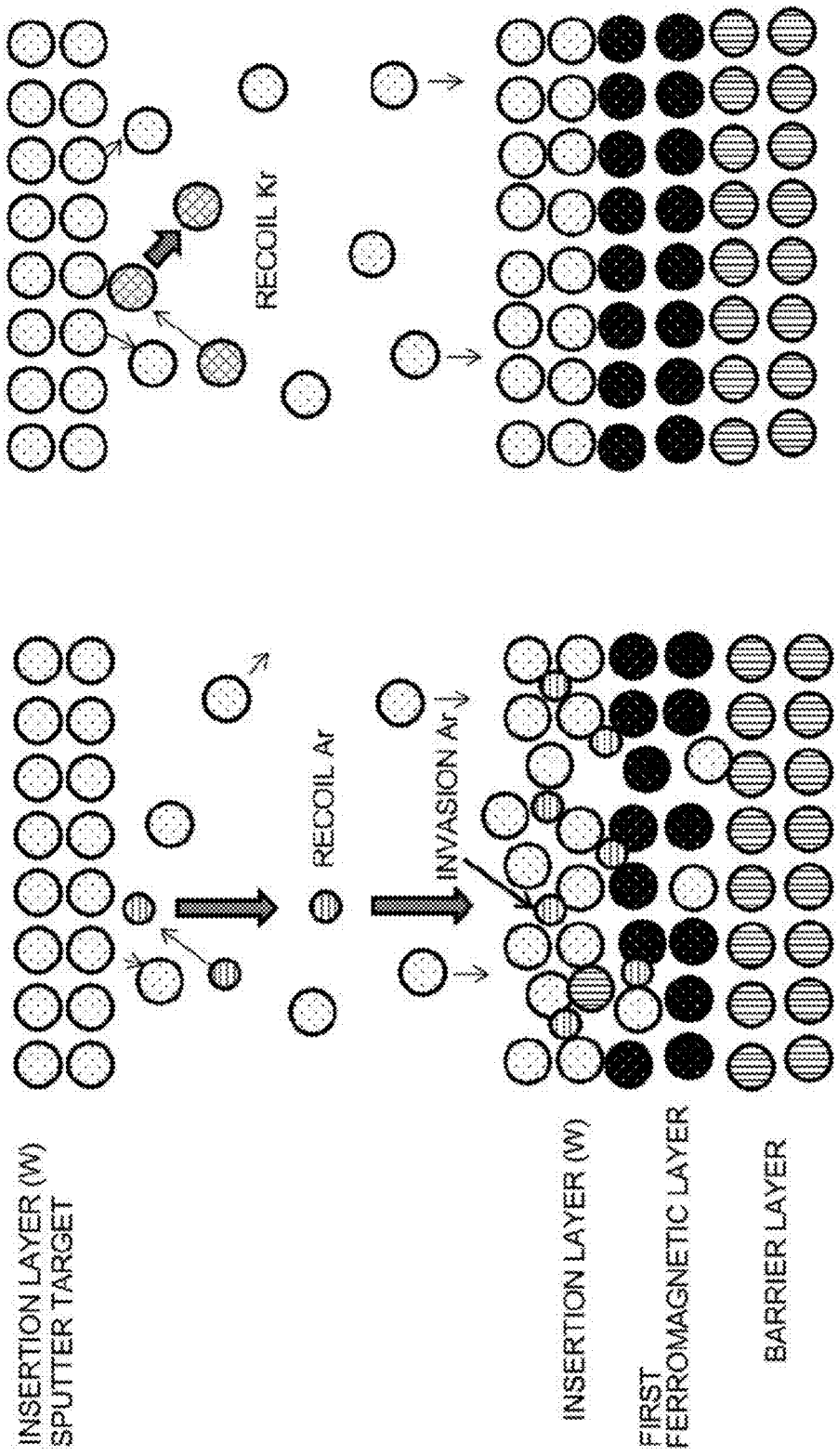
FIG. 13 is a cross-sectional image illustrating damage caused to a first ferromagnetic layer in a case where W of the insertion layer is formed using Ar gas and Kr gas according to example 2.

The reason for such improvement of TMR ratio and perpendicular magnetic anisotropy described above is considered to be caused by the same reason (phenomenon) as example 1. The energy of sputtering gas recoiled from the target during sputtering is determined by the difference in mass numbers of the target and the sputtering gas. That is, similar to the case of example 1, the ratio of mass number of W to the mass number of Ar (=W/Ar) is approximately 4.6, whereas the ratio of mass number of W to the mass number of Kr (=W/Kr) is approximately 2.2, which is approximately half the case of Ar, and the energy of the sputtering gas being recoiled is approximately half in the case of film deposition with Kr compared to film formation with Ar. As a result, as illustrated in FIG. 13, in the case of film deposition with Ar, the insertion layer causes damage to the first ferromagnetic layer at the lower layer by recoiled Ar (left drawing of FIG. 13). Meanwhile, in film formation with Kr, it is considered that the first ferromagnetic layer is not damaged (right drawing of FIG. 13), and thereby, the first ferromagnetic layer can be prevented from being damaged.

Further, since material such as W is not implanted to the first ferromagnetic layer, W is prevented from being diffused to the inner side by heat treatment during manufacture. Thereby, it is considered that deterioration of TMR ratio and perpendicular magnetic anisotropy could be prevented and the result as shown in FIG. 12 could be achieved.

According to examples 1 and 2 described above, Kr was used as sputtering gas to prevent deterioration of TMR ratio and perpendicular magnetic anisotropy, but the present invention is not restricted to Kr. Similarly, xenon (Xe) which is rare gas having a greater mass number can be used.

Next, the measurement results of TMR ratio of MTJ with respect to the first ferromagnetic layer of cases where Xe gas film formation of the insertion layer 22 was performed in addition of Kr gas film formation and the characteristics graph thereof are illustrated. For comparison, the measurement value of film formation with Ar is also shown, and in Table 4, the measurement values of film formation using Kr gas, Xe gas and Ar gas of first ferromagnetic layer having film thicknesses of 0.6 nm to 1.4 nm at 0.2 nm pitches are shown.

TABLE 4

|  | FILM THICKNESS OF FIRST FERROMAGNETIC LAYER (nm) | | | | |
| --- | --- | --- | --- | --- | --- |
|  | 0.6 | 0.8 | 1.0 | 1.2 | 1.4 |
| FILM FORMATION with Xe (%) | 140.0 | 161.4 | 170.8 | 174.5 | 170.9 |
| FILM FORMATION with Kr (%) | 127.5 | 151.5 | 162.0 | 165.8 | 168.1 |
| FILM FORMATION with Ar (%) | 64.0 | 95.3 | 139.3 | 156.6 | 157.6 |

Figure 14:
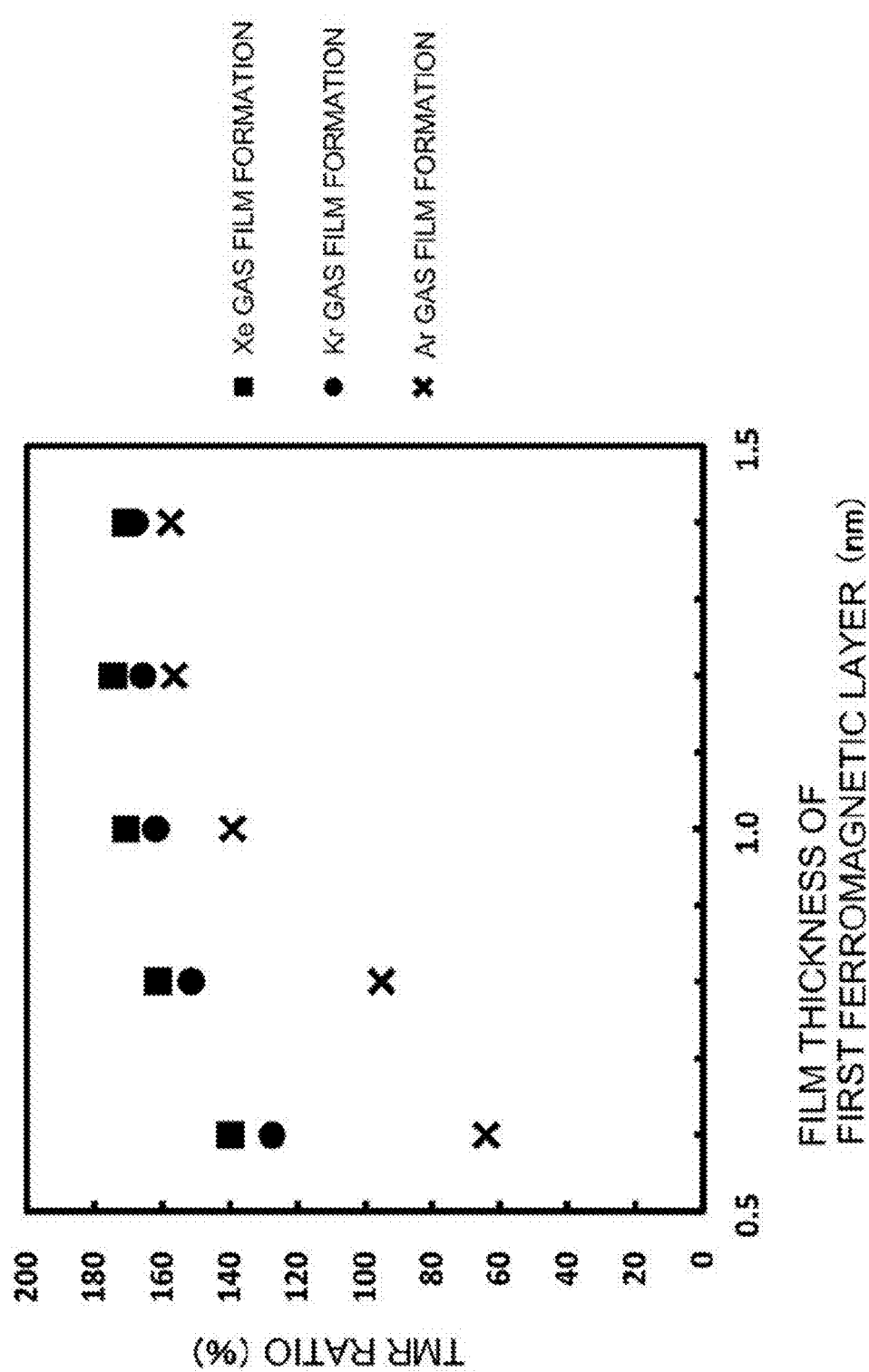
FIG. 14 is a view illustrating a dependency of TMR ratio value to film thickness of first ferromagnetic layer in a case where W of the insertion layer is sputtered using Kr, Xe and Ar according to example 2.

FIG. 14 is a characteristics graph illustrated based on Table 4.

As illustrated in FIG. 14, compared to the TMR ratio of MTJ of cases where the insertion layer is sputtered using Ar, the TMR ratio of MTJ of cases where the insertion layer is sputtered using Kr or Xe was improved when the film thickness of the first ferromagnetic layer is from 0.6 nm to 1.4 nm, which was improved by 14 to 99% in the case of Kr and improved by 7 to 119% in the case of Xe. That is, in the case of Xe, similar to the case of Kr, high results have been acquired for all film thicknesses of the first ferromagnetic layer. Further, in the case of Ar, there is a tendency that the TMR ratio drops significantly if the film thickness of the first ferromagnetic layer becomes thinner than 1.0 nm, but such tendency was greatly improved in both Kr and Xe cases. By comparing Kr and Xe, higher results were generally achieved in the case of Xe.

In the case of film formation with Xe, the ratio of mass number of W to mass number of Xe (=W/Xe) was approximately 1.4, which is approximately ⅓ of the case of Ar, and even smaller than in the case of Kr described earlier. In other words, the energy of sputtering gas being recoiled is further reduced compared to the case of film formation with Kr. As a result, similar to the film formation with Kr illustrated in FIG. 13, damage is not caused to the first ferromagnetic layer and it is estimated that the effect is further effective than the case of film formation with Kr if the film thickness of the first ferromagnetic layer is thinned.

Next, the measurement results of TMR ratio of MTJ with respect to the insertion layer film thickness of cases where the insertion layer 22 is formed by Kr gas film formation or Xe gas film formation and the characteristics graph thereof are illustrated. In the above-described measurement of film thickness dependency of the first ferromagnetic layer, the film thickness of the insertion layer was fixed to 0.3 nm, but in measurement of film thickness dependency of the insertion layer, the film thickness of the first ferromagnetic layer was fixed to 1.0 nm. Similarly, for comparison, the measurement value of the film formation with Ar is illustrated, and Table 5 shows the measurement values of film formation using Kr gas, Xe gas and Ar gas for cases where the film thicknesses of the insertion layer are set to 0.2 nm, 0.3 nm and 0.5 nm.

TABLE 5

| | FILM THICKNESS OF INSERTION LAYER (nm) | | |
|---|---|---|---|
| | 0.2 | 0.3 | 0.5 |
| FILM FORMATION with Xe (%) | 186.1 | 186.0 | 176.9 |
| FILM FORMATION with Kr (%) | 191.7 | 176.9 | 163.1 |
| FILM FORMATION with Ar (%) | 117.9 | 127.0 | 35.0 |

Figure 15:
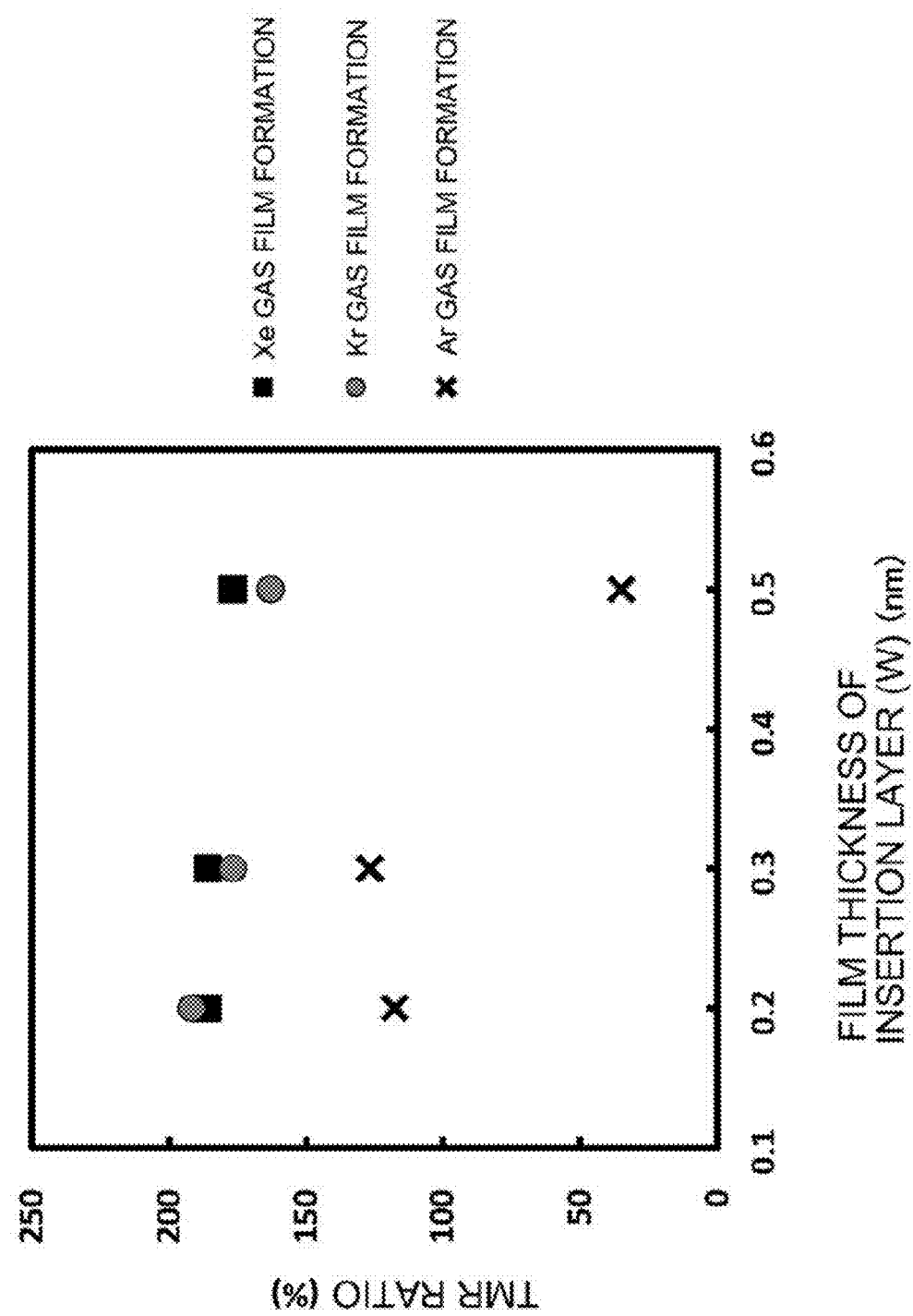
FIG. 15 is a view illustrating a dependency of TMR ratio value to insertion layer film thickness in a case where W of the insertion layer is sputtered using Kr, Xe and Ar according to example 2.

FIG. 15 is a characteristics graph illustrated based on Table 5.

As illustrated in FIG. 15, generally, the TMR ratio tends to be higher if the film thickness of the insertion layer is thinner, and the TMR ratio tends to drop as the film thickness increases. The rate in which the TMR ratio drops according to film thickness is smaller for Xe having a large mass number, and it can be recognized that the rate increases in the order of Kr and Ar as the mass number becomes smaller. This tendency matches the result illustrated in FIG. 8 where the magnetic coupling layer was sputtered by Kr. The TMR ratio is generally higher in the data illustrated in FIG. 15 than the data illustrated in FIG. 8, but this is because the film forming conditions of the reference layer and the tunnel barrier have been improved.

Table 6 illustrates the mass number ratio (value of "T/G") of cases where argon (Ar, mass number 40), krypton (Kr, mass number 84) and xenon (Xe, mass number 131) are respectively used as sputtering gas (referred to as "G") for cases where the target (referred to as "T") is, in addition to tungsten (W, mass number 183) and tantalum (Ta, mass number 180), hafnium (Hf, mass number 178), molybdenum (Mo, mass number 96), niobium (Nb, mass number 93), zirconium (Zr, mass number 91), yttrium (Y, mass number 89), scandium (Sc, mass number 45), titanium (Ti, mass number 47), vanadium (V, mass number 51) and chromium (Cr, mass number 52) as films constituting the magnetic coupling layer and the insertion layer described earlier.

TABLE 6

| | G | | |
|---|---|---|---|
| T | ARGON (Ar) | KRYPTON (Kr) | XENON (Xe) |
| TUNGSTEN (W) | 4.6 | 2.2 | 1.4 |
| TANTALUM (Ta) | 4.5 | 2.1 | 1.4 |
| HAFNIUM (Hf) | 4.5 | 2.1 | 1.4 |
| MOLYBDENUM (Mo) | 2.4 | 1.1 | 0.7 |
| NIOBIUM (Nb) | 2.3 | 1.1 | 0.7 |
| ZIRCONIUM (Zr) | 2.3 | 1.1 | 0.7 |
| YTTRIUM (Y) | 2.2 | 1.1 | 0.7 |
| SCANDIUM (Sc) | 1.1 | 0.5 | 0.3 |
| TITANIUM (Ti) | 1.2 | 0.6 | 0.4 |
| VANADIUM (V)) | 1.3 | 0.6 | 0.4 |
| CHROMIUM (Cr) | 1.3 | 0.6 | 0.4 |

As described, since effects according to the present invention can be expected to be achieved by using Kr and Xe as sputtering gas, it is necessary to select a sputtering gas in which a mass number ratio with respect to the target is at least 2.2 or smaller.

Further, it is also possible to combine examples 1 and 2, that is, to form the magnetic coupling layer by example 1 and form the insertion layer of the recording layer by example 2, so as to form the magnetic tunnel junction element.

Example 3

Figure 16:
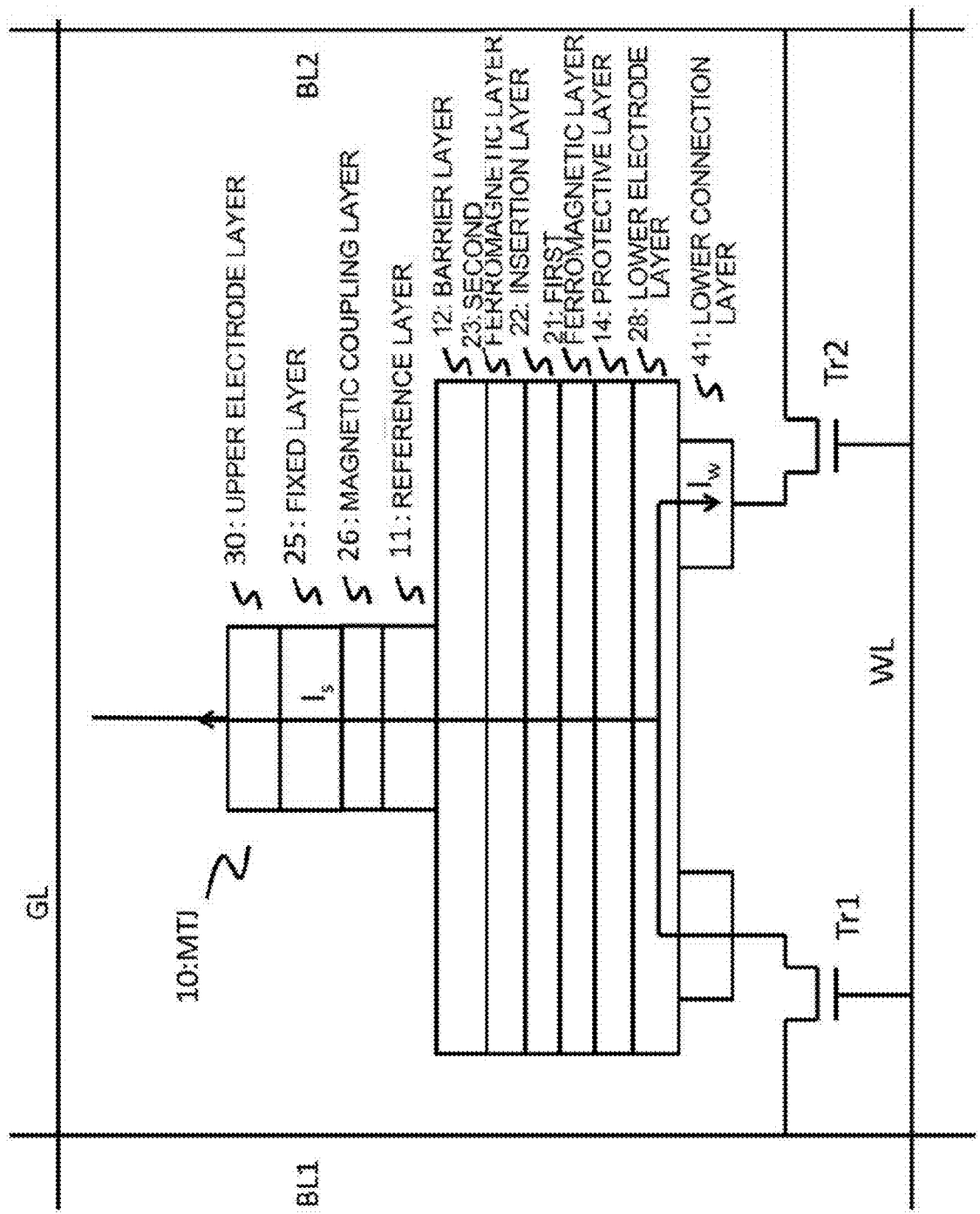
FIG. 16 is a block circuit diagram illustrating a magnetic memory in a case where a magnetic tunnel junction element according to the present invention is applied to a three-terminal SOT element according to example 3.

The magnetic tunnel junction element according to the present invention is applicable not only to STT elements but also to three-terminal SOT (Spin Orbit Torque) elements. FIG. 16 is a block circuit diagram of a magnetic memory of a case where the magnetic tunnel junction element according to the present invention is applied to the SOT element.

In the magnetic memory cell illustrated in FIG. 16, the magnetic tunnel junction element 10 is connected to a first bit line BL1, a second bit line BL2, a word line WL and a ground line GL That is, the terminal connected to the upper portion of the magnetic tunnel junction element 10 is connected to the ground line GL. Further, both ends of the lower electrode layer 28 are connected via a lower connection layer 41 to a source or a drain of a first cell transistor Tr1 and a second cell transistor Tr2. The gate electrodes of the first cell transistor Tr1 and the second cell transistor Tr2 are connected to the word line WL. Further, the terminals on an opposite side as the side connected to the magnetic tunnel junction element 10 of the source or drain of the first cell transistor Tr1 and the second cell transistor Tr2 are respectively connected to the first bit line BL1 and the second bit line BL2.

In order to write information to this magnetic memory cell using the SOT element, the word line WL is set to high level, by which the first cell transistor Tr1 and the second cell transistor Tr2 are set to on states. Further, by setting either one of the first bit line BL1 and the second bit line BL2 to high level, it becomes possible to write information to the magnetic tunnel junction element 10.

In order to read information, the word line WL is set to high level, by which the first cell transistor Tr1 and the second cell transistor Tr2 are set to on state. Further, by setting both the first bit line BL1 and the second bit line BL2 to high level, or by setting either one to high level and the other to open, information can be read from the magnetic tunnel junction element 10.

REFERENCE SIGNS LIST 10 magnetic tunnel junction (MTJ) element
11 reference layer
12 barrier layer
13 recording layer
14 protective layer
15 base layer
21 first ferromagnetic layer
22 insertion layer
23 second ferromagnetic layer
25 fixed layer
26 magnetic coupling layer
27 substrate
28 lower electrode layer
29 underlayer
30 upper electrode layer
31 third ferromagnetic layer
32 fourth ferromagnetic layer 33 nonmagnetic layer
41 lower connection layer
50 magnetic memory circuit
51 X driver
52 Y driver
53 source line driver
54 sense amplifier
55 storage cell
56 selection transistor

The invention claimed is:

1. A method for manufacturing a magnetic tunnel junction element, the magnetic tunnel junction element configured by stacking, in a following stack order, or alternatively, configured by stacking in an opposite order as the following stack order,
- a fixed layer formed of a ferromagnetic body,
- a magnetic coupling layer formed of a nonmagnetic body,
- a reference layer formed of a ferromagnetic body,
- a barrier layer formed of a nonmagnetic body, and
- a recording layer formed of a ferromagnetic body,
- wherein the fixed layer and the reference layer are formed as a perpendicular magnetization film in which a magnetization direction is fixed,
- the recording layer is formed as a perpendicular magnetization film in which a magnetization direction is variable and having perpendicular magnetic anisotropy at an interface between the barrier layer,
- the nonmagnetic body forming the magnetic coupling layer is tantalum (Ta) or tungsten (W), and
- the magnetic coupling layer is formed using krypton (Kr) as sputtering gas.

2. The method for manufacturing a magnetic tunnel junction element according to claim 1, wherein the fixed layer contains platinum (Pt).

3. The method for manufacturing a magnetic tunnel junction element according to claim 1, wherein the nonmagnetic body forming the magnetic coupling layer is tungsten (W).

4. A method for manufacturing a magnetic tunnel junction element, the magnetic tunnel junction element configured by stacking, in a following stack order, or alternatively, configured by stacking in an opposite order as the following stack order,
- a reference layer formed of a ferromagnetic body,
- a barrier layer formed of a nonmagnetic body, and
- a recording layer formed by sandwiching an insertion layer formed of a nonmagnetic body between first and second ferromagnetic layers,
- wherein the reference layer is formed as a perpendicular magnetization film in which a magnetization direction is fixed,
- the first ferromagnetic layer constituting the recording layer is formed as a perpendicular magnetization film in which a magnetization direction is variable and having perpendicular magnetic anisotropy at an interface between the barrier layer,
- the nonmagnetic body forming the insertion layer is tantalum (Ta) or tungsten (W), and
- the insertion layer is formed using krypton (Kr) as sputtering gas.

5. The method for manufacturing a magnetic tunnel junction element according to claim 4, wherein the nonmagnetic body forming the insertion layer is tungsten (W).

* * * * *